United States Patent [19]

Leininger

[11] Patent Number: 4,821,182
[45] Date of Patent: Apr. 11, 1989

[54] MEMORY ADDRESS DECODING SYSTEM

[75] Inventor: Steven Leininger, Arlington, Tex.

[73] Assignee: Tandy Corporation, Fort Worth, Tex.

[21] Appl. No.: 776,490

[22] Filed: Sep. 16, 1985

Related U.S. Application Data

[60] Division of Ser. No. 525,167, Aug. 22, 1983, Pat. No. 4,563,676, which is a division of Ser. No. 342,069, Jan. 25, 1982, Pat. No. 4,500,956, which is a division of Ser. No. 261,976, May 8, 1981, Pat. No. 4,430,649, which is a continuation of Ser. No. 926,957, Jul. 21, 1978.

[51] Int. Cl.$^4$ ................... G06F 13/00; G06F 7/00
[52] U.S. Cl. .................................................. 364/900
[58] Field of Search ... 364/200 MS File, 900 MS File

[56] References Cited

U.S. PATENT DOCUMENTS

| | | | |
|---|---|---|---|
| 3,969,701 | 7/1976 | Hemdal | 364/200 |
| 4,028,683 | 6/1977 | Divine et al. | 364/900 |
| 4,040,029 | 8/1977 | Young | 364/900 |
| 4,328,558 | 5/1982 | Musa et al. | 364/900 |

Primary Examiner—Eddie P. Chan
Attorney, Agent, or Firm—Wolf, Greenfield & Sacks

[57] ABSTRACT

The computer system of this invention has a simple processing unit for providing most data processing by the computer system under control of a read-only memory which contains instructions and other data for the CPU. The system also includes a random access memory, a keyboard, a video terminal, and a port device in the form of a tape recorder/player. A master clock initiates timing used throughout the system. A multi-line data bus interconnects the CPU and the different memories of the system including the keyboard and the video RAM. Bi-directional communication is possible on the data bus. The addressing of these different memories is by way of an address bus from the CPU, which is a uni-directional bus. Data to be operated upon is stored in the random access memory. The keyboard is used for inputting data to the CPU and the video terminal is used for displaying data. Features of the present invention include a special reset scheme for the CPU, a multiplexing scheme for addressing the RAM, a technique for simply altering the control to provide capabilities of different capacity memories, alternate display of characters to provide either a 32-character line or a 64-character line, an improved keyboard selection scheme, and improved video processing means.

3 Claims, 15 Drawing Sheets

Fig. 2

| HEX ADDRESS | DESCRIPTION OF CONTENTS/USAGE |
|---|---|
| 0000 To 0FFF | LEVEL I ROMS |
| 1000 To 37FF | NOT USED |
| 3800 To 380F | KEYBOARD |
| 3810 To 3BFF | NOT USED |
| 3C00 To 3FFF | VIDEO DISPLAY |
| 4000 To 41FF | RAM USED BY BASIC LEVEL I |
| 4200 To 4FFF | USEABLE RAM STARTS HERE |
| 5000 To 5FFF | RAM |
| 6000 To 7FFF | RAM |
| 8000 To FFFF | NOT USED |

4K RAM, 8K RAM, 16K RAM

Fig. 3

```
                 A15 A14 A13 A12 A11 A10 | A9 A8
FROM: HEX 0000    0   0   0   0   0   0  | 0  0
                                         |          LEVEL I ROMs
TO:   HEX 0FFF    0   0   0   0   1   1  | 1  1

FROM: HEX 3800    0   0   1   1   1   0  | 0  0
                                         |          KEYBOARD
TO:   HEX 380F    0   0   1   1   1   0  | 0  0

FROM: HEX 3C00    0   0   1   1   1   1  | 0  0
                                         |          DISPLAY RAMS
TO:   HEX 3FFF    0   0   1   1   1   1  | 1  1

FROM: HEX 4000    0   1   0   0   0   0  | 0  0
                                         |          4K RAM
TO:   HEX 4FFF    0   1   0   0   1   1  | 1  1

FROM: HEX 4000    0   1   0   0   0   0  | 0  0
                                         |          16K RAM
TO:   HEX 7FFF    0   1   1   1   1   1  | 1  1
```

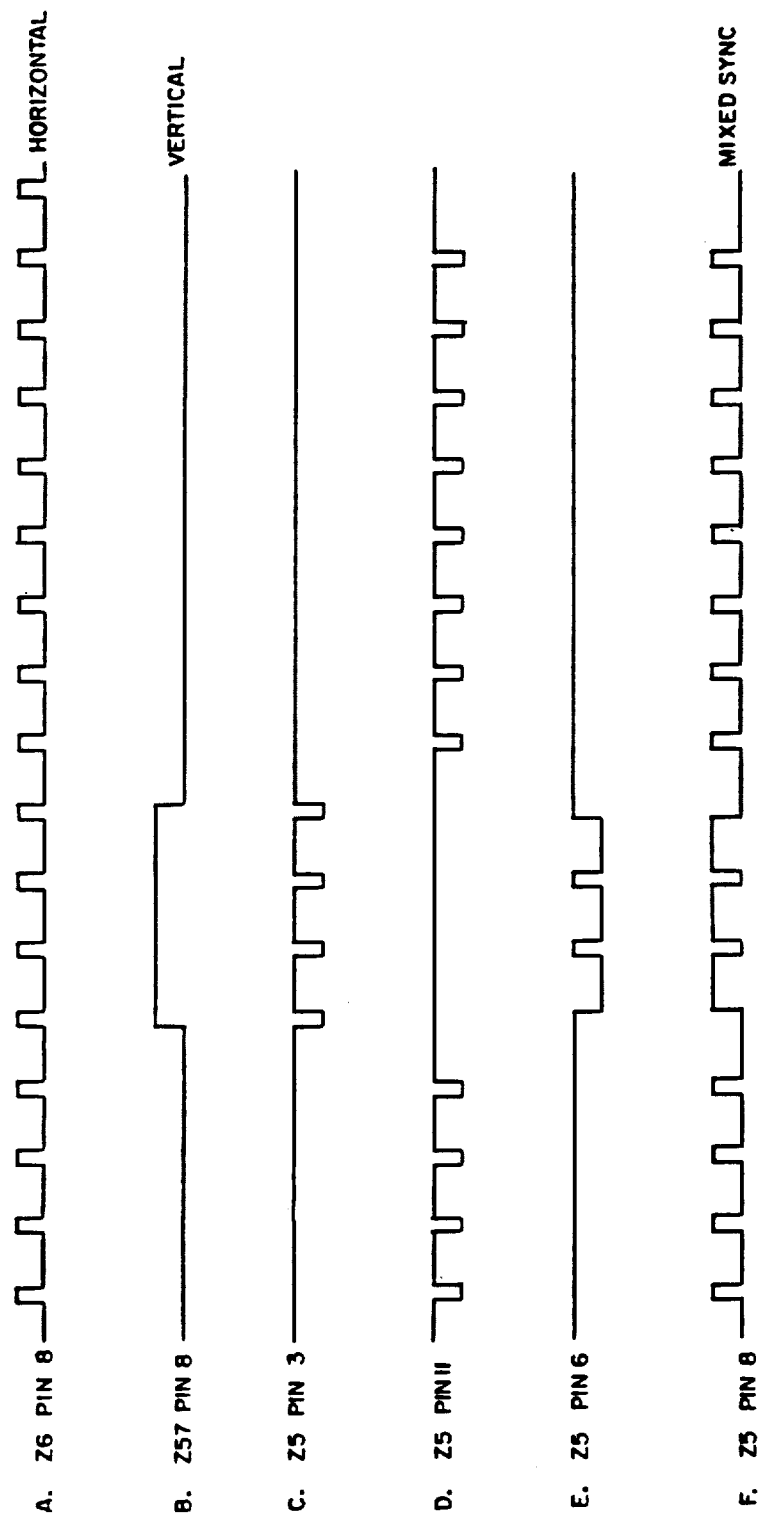

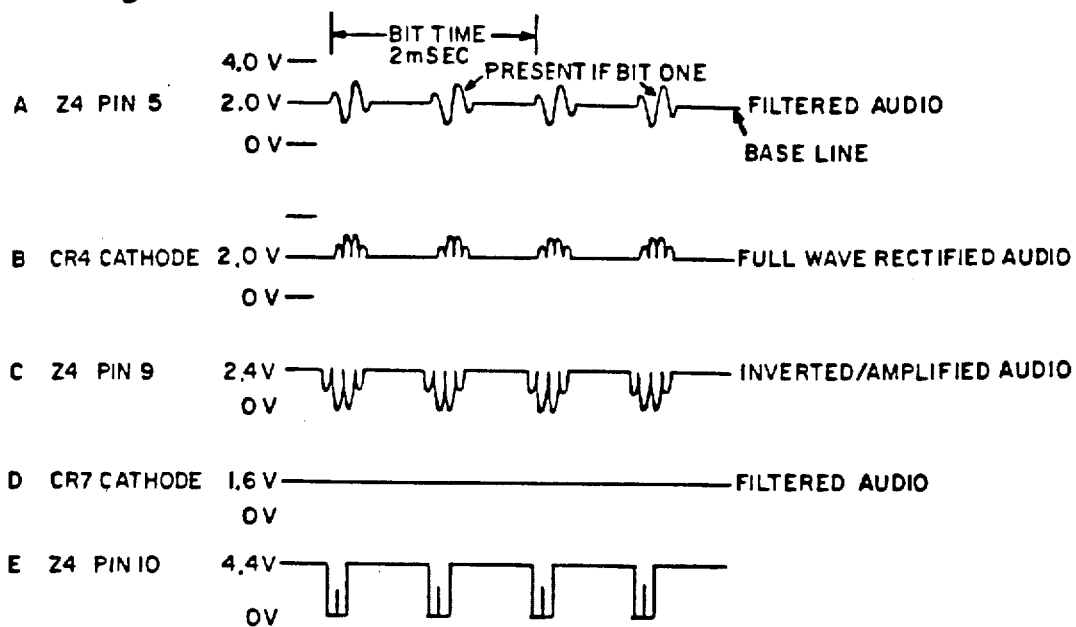
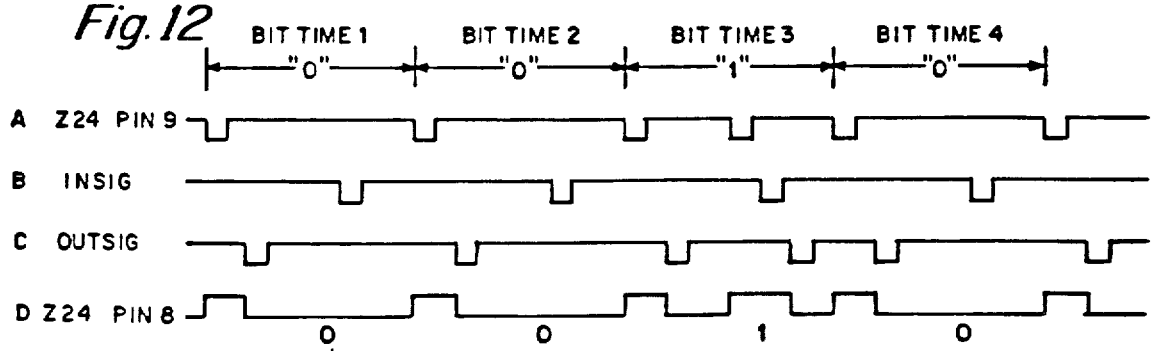

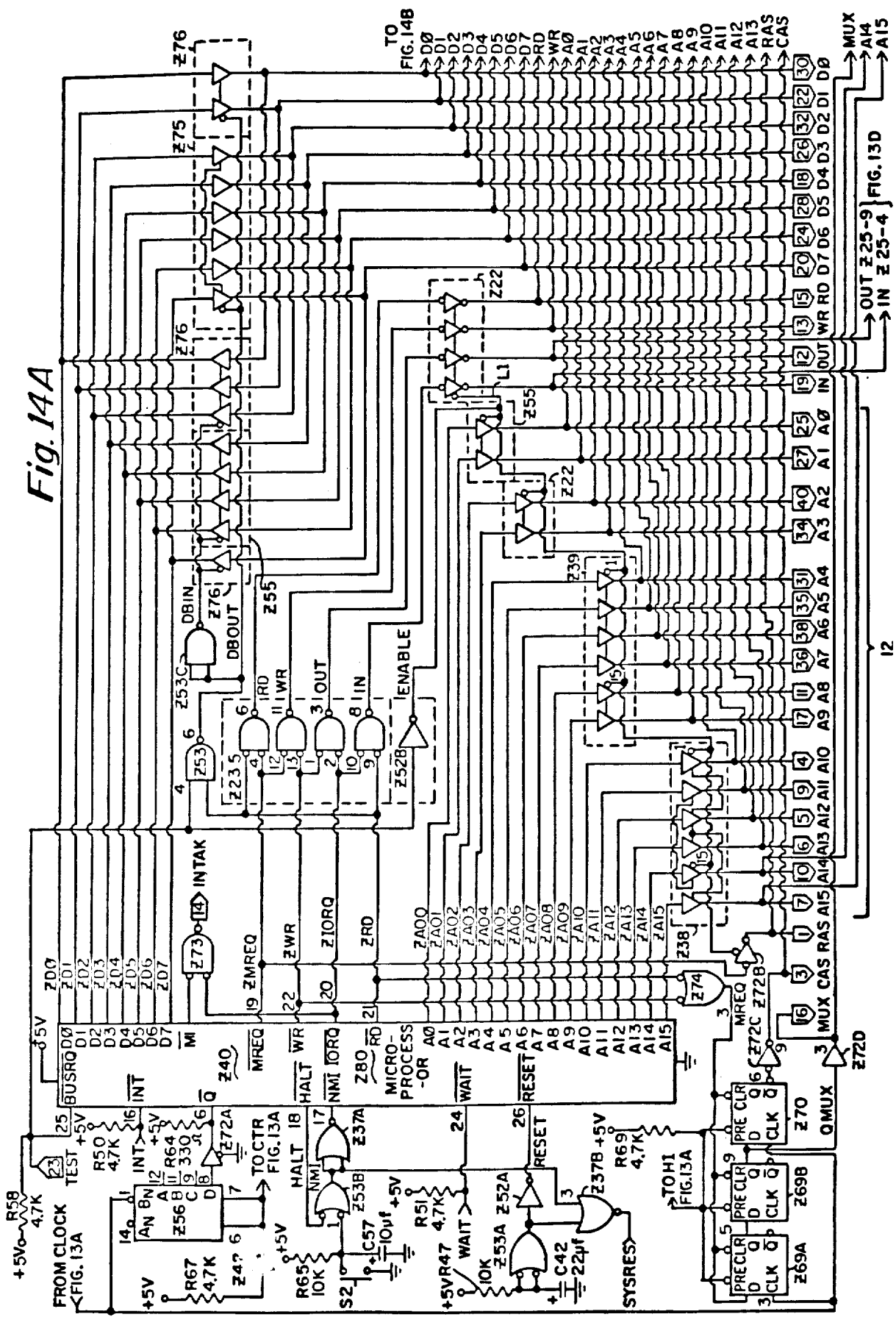

MEMORY ADDRESS DECODING SYSTEM

This application is a division of application Ser. No. 525,167, filed Aug. 22, 1983, now U.S. Pat. No. 4,563,676, which in turn is a division of Ser. No. 342,069 filed Jan. 25, 1982, now U.S. Pat. No. 4,500,956 which in turn is a division of Ser. No. 261,976 filed May 8, 1981, now U.S. Pat. No. 4,430,649, which is a continuation of Ser. No. 926,957 filed July 21, 1978.

BACKGROUND AND SUMMARY OF THE INVENTION

The present invention relates in general to a computer system and pertains more particularly to a system that is constructed quite inexpensively employing on the order of 80 integrated circuits and having the capability of communicating with a number of port devices.

One object of the present invention is to provide an improved computer system having manual reset means for controlling the central processing unit.

Another object of the present invention is to provide an improved addressing scheme for the random access memory of the system.

A further object of the present invention is to provide a computer system that has the capability of a video output that may be either alpha numeric or graphic.

Still another object of the present invention is to provide a computer system having a video output for providing different size characters. In accordance with the present invention the output can be controlled so as to display either 32 characters per line or 64 characters per line.

Another object of the present invention is to provide an improved computer system for providing a chain control of the video RAMs or alternatively control directly from the data bus of the CPU.

Another object of the present invention is to provide a computer system having the capability of graphic display. In accordance with the invention, the display field is demarcated into rectangular segments with each segment in turn sectioned into, for example, 6 parts which are individually selectable by data bus information.

Still another object of the present invention is to provide an improved computer system having a novel keyboard entry scheme.

A further object of the present invention is to provide an improved computer system having a novel port control particularly useful with a port device such as a tape recorder/player.

To accomplish the foregoing and other objects of this invention, there is provided a computer system including a central processing unit, means for storing instructions for the central processing unit disclosed as a read-only memory (ROM), random access memory means for storing data, keyboard means for entering data into the computer system, and display means disclosed in the form of a conventional CRT television display. Connections from the central processing unit, (CPU) include control lines, a plurality of data lines, forming a data bus and a plurality of address lines, forming an address bus. The data lines are bidirectional whereas the address lines are uni-directional. The CPU interrogates other components of the computer system by way of the address bus to indicate where the data it is looking for is located. The data bus is the means of communication for data both to and from the CPU. The ROM contains the instructions for the CPU indicating to the CPU what to do, how to carry out the instruction, and where to put the data after the instruction is completed. The CPU essentially looks to the ROM for instructions and then follows the instructions of the ROM. In all communications, the CPU applies address locations to both the ROM, RAM, and keyboard. However, address decoding determines which of these actual memories the CPU is looking for. In the system of this invention only the CPU communicates with all other sections. For example, data is to be transferred from the ROM into the RAM, the transfer is accomplished by way of the CPU. The keyboard means enables entry of instructions and data to the CPU. The system of this invention also includes a video random access memory (video RAM) which couples to a video processing section which in turn couples to a video output terminal or monitor such as a television receiver. Data in the video RAM is automatically displayed on the monitor.

In accordance with the present invention, there is provided a means for readily selecting different capacity memories especially with regard to the random access memory of the computer system. In this regard the system of the present invention employs an address decoder for ROM/RAM selection. The address decoder is responsive to an address code from the central processing unit for providing separate outputs, some of which at least correspond to different coded inputs representative of different capacity memories. At the output of the address decoder, there is a selection means for selecting different outputs from the address decoder to provide a memory enable signal. The address decoder in accordance with the present invention preferably decodes the higher order address lines, specifically four such lines, with the output of the decoder providing up to 8 output signals, only one of which at a time is active. The selection means preferably includes a selection shunt means having input terminals coupling to the address decoder and with some of its output terminals commonly tied to provide the memory enable signal. One section of the shunt preferably contains 4 shorting bars, commonly tied at their output terminals. For a 4K memory capacity, one bar is shorted, for 8K, two bars are shorted, for 12K, three bars are shorted, and for 16K, all four bars are shorted. In the disclosed embodiment this means that the enabling signal for the random access memory is active all the way from address 4000 to address FFFF.

DESCRIPTION OF THE DRAWINGS

Numerous other objects, features and advantages of the invention should now become apparent upon a reading of the following detailed description taken in conjunction with the accompanying drawings, in which:

FIG. 2 shows a memory map in accordance with this invention;

FIG. 3 is a table of addresses for identifying the different memory devices of the system;

FIG. 8 is a timing diagram associated with the video processing section showing sync mixing;

FIG. 11 shows audio processing waveforms also associated with the circuitry of FIG. 13B;

FIG. 12 is a timing diagram also associated with the port device shown in FIG. 13D;

FIGS. 14A and 14B show in detail most of the other portion of a detailed system of this invention;

DETAILED DESCRIPTION

Figure 1:
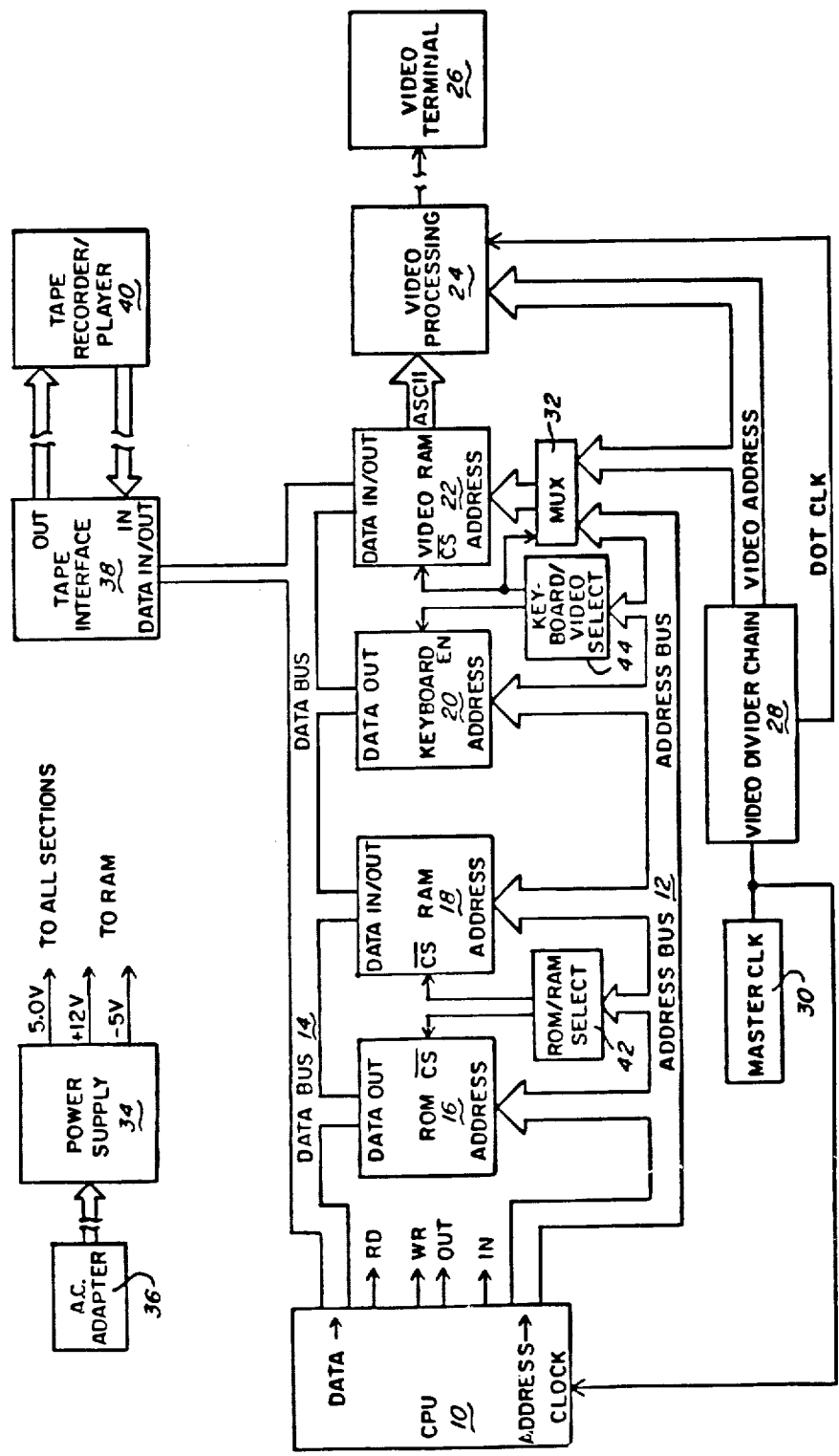
FIG. 1 is a block diagram of the computer system of the present invention.

FIG. 1 is a system block diagram of the computer of this invention. The overall computer may comprise on the order of 80 integrated circuits or separate chips, however, the system is basically broken down into the primary components shown in FIG. 1. In FIG. 1 these different sections comprising the computer are disclosed along with their interrelationship therebetween. The heart of the system may be considered as the central processing unit (CPU) 10. The CPU 10 and other components of the system are shown in more detail hereinafter with regard to a specific preferred embodiment thereof. In the block diagram of FIG. 1 multiple lines such as data lines and address lines are shown by respective data and address buses.

Most of the connections at the CPU are data lines and address lines. The CPU interrogates other sections of the computer by way of the address bus so as to indicate where the data it is looking for is located. The data bus is the vehicle for information transfer to and from the CPU. FIG. 1 shows the address bus 12 and the data bus 14. The address lines of the address bus 12 only provide for communication from the CPU to other sections of the system. On the other hand, the data lines of the data bus 14 permit bi-directional communication between the CPU and other sections of the system.

The read only memory (ROM) contains the operating program of the system. For example, the ROM indicates to the CPU what to do, how to do it, and where to transfer the data after the instruction is completed. When power is first applied to the system, the CPU outputs an address to the ROM 16 so as to locate the first instruction for the CPU. The CPU initializes communication by outputting an address to the ROM. The CPU performs all the housekeeping tasks for the system.

In FIG. 1 in addition to the ROM 16, the system also comprises a random access memory (RAM) 18. The random access memory 18 stores data which is to be operated upon by this CPU and also stores programs for providing certain control of the CPU.

Assuming that the operator of the computer inputs instructions to the computer via the keyboard 20, such as to count to the number N, then the CPU 10 stores the instruction in the RAM 18. The intercommunication between the sections is as follows. The CPU signals the ROM an instruction has been entered. The ROM signals the CPU to interrogate the keyboard to determine the instruction. The CPU then signals the ROM to initiate instructions. The ROM then interrogates the CPU initiating communication with the RAM. The ROM program essentially signals the CPU how to perform the instruction of counting to the number N. After this has been completed, the ROM signals the CPU to determine what to do with the data. The CPU informs the ROM that the number N is to go to the display and is to be also stored. The ROM signals the CPU how to put the data on the display and then also indicates where to store the number N in the RAM. The CPU signals the ROM when the job is completed. The ROM then indicates to the CPU to maintain a monitoring condition of the keyboard.

The CPU executes instructions and runs programs in the ROM. The CPU then follows the instructions of the ROM and looks to the keyboard and then to the RAM. In all cases. the CPU applies address locations to the ROM, RAM and keyboard. The data lines are then checked for input data that corresponds to these address locations. In case of an output from the CPU to the RAM, the CPU selects the address, puts data on the data lines, and then instructs the RAM to store the data this is on the data lines.

In the system of this invention, only the CPU communicates with all other sections. If the CPU is signalled by the ROM to store something from the ROM into the RAM, the CPU cannot make the RAM receive the ROM data directly. Instead, the CPU takes the data from the ROM and transmits it to the RAM. The CPU essentially functions as an intermediary between these two sections of the system. This is because the CPU is the only section that can address locations and pass data to all other sections.

The keyboard section 20 is the means for making known the instructions to the CPU. The system also includes a video random access memory (video RAM) 22 which has its output coupled by way of the video processing section 24 to a video terminal or monitor 26. Data in the video ram 22 is automatically displayed on the monitor 26. The video processing section 24 handles this transfer. Data outputted from the video RAM 22 is in ASCII code. The video processer 24 has as its function the conversion of the ASCII code into alphanumeric symbols for display on the monitor 26. The ROM 16 contains all of the dot patterns for forming these alphanumeric symbols. The ASCII code from section 22 identifies the character pattern, and the video processer 24 sends this pattern to the monitor 26 on, of course, a synchronized basis.

The composite video signal which is coupled to the video monitor 26 is typically a complex signal. In addition to the video signal, this signal also includes horizontal and vertical synchronization. These signals must be quite stable and outputted in the proper sequence. In accordance with the present invention the video divider chain 28 under control of the master clock 30 handles this control. The video divider chain 28 generates the sync signals, and addresses the video RAM in a logical order so that the video processer 24 can handle the video data efficiently. Associated with the video RAM 22 is a multiplexer (MUX) 32 discussed in more detail hereinafter. This multiplexer functions analogously to a multi-pole, multi-position switch. When the video divider chain is in control, the MUX 32 is switched so that only addresses from the divider chain are directed to the video RAMs. The CPU may need to read or write data into the video RAM. If so, the MUX is switched so that the CPU has control over the addresses of the video RAM. After the CPU is finished processing, the addressing task is reassigned to the divider chain.

FIG. 2 shows a table of a memory map in accordance with the present invention representing the addresses as HEX addresses. For the basic system, the read only memory locations are ØØØØ to ØFFF. The keyboard is controlled through addresses 38ØØ to 38ØF. The video display is located from address 3CØØ to address 3FFF. The RAM addresses commence at address 4ØØØ and depending upon the capacity of the memory in the system, can extend all the way down to address 7FFF.

As mentioned previously, upon power-up, an address location is outputted from the CPU requesting information from the ROM. Since the ROM is controlled from the lower addresses, the CPU is outputting addresses in this area. If the CPU requires keyboard data, it will output addresses 38ØØ-38ØF and determine if anything is in this "memory" location. If the CPU desires to show the programmer something on the display, the CPU addresses the video display section of the map storing data in these locations. The video display shows exactly what is in memory locations 3CØØ-3FFF. In FIG. 2, although the RAM locations extend from 4ØØØ to 4FFF, part of these locations are used for general housekeeping tasks. Hence, the user accessible RAM actually starts at address 42ØØ.

FIG. 1 also shows a power supply 34 for providing certain voltages useable in the system of this invention. This power supply may be operated by way of an AC adapter 36 from a conventional AC power line. Also shown in FIG. 1 is the tape interface 38 and tape recorder/player 40. The tape interface 38 ties into the data bus 14 and will be discussed in more detail hereinafter. Also shown in FIG. 1 is a ROM/RAM select 42 for receiving data on the address bus 12 to select either the ROM 16 or the RAM 18. Similarly, the system includes a keyboard/video select 44 for selecting either keyboard 20 or video RAM 22. Again, further description is found hereinafter with regard to this portion of the system.

FIG. 1 discloses the basic components of the system of this invention and hereinbefore has been a brief description of some typical operation of this system. Now a discussion follows of the theory of operation of a preferred specific example of a computer system of this invention. In this connection reference is made to FIGS. 13-16.

SYSTEM CLOCK

Figure 13A:
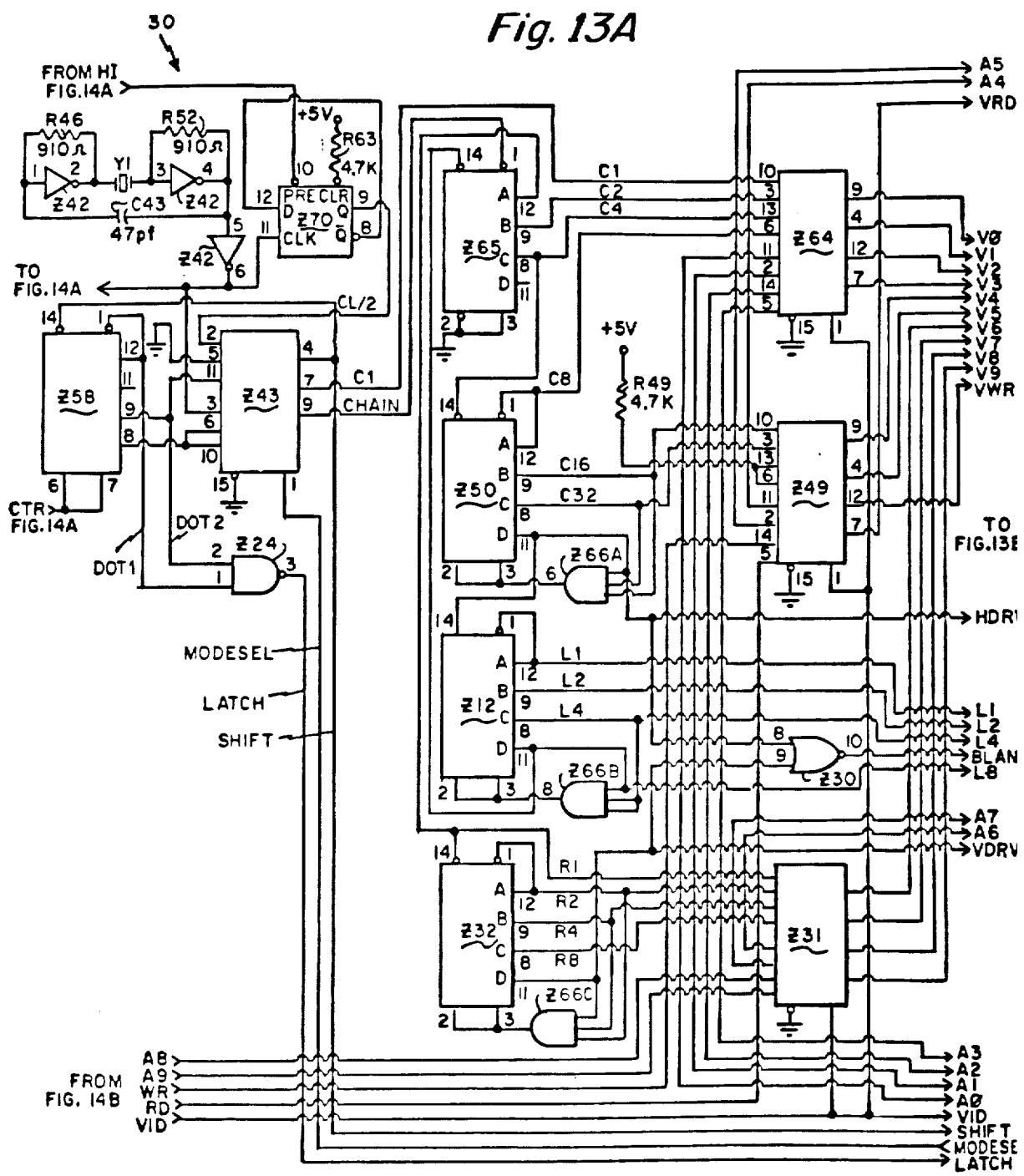
FIGS. 13A-13D show in detail one portion of the system of the present invention.

The system clock or master clock depicted in FIG. 1 as clock 30 is shown in detail in FIG. 13A. The system clock 30 comprises a fundamental cut, crystal Y1 having a fundamental frequency of 10.6445 MHz, and two inverters Z42 which form along with resistors R46 and R52 and capacitor C43, a series resonant circuit. Feedback between the inverters is supplied by capacitor C43. Resistors R46 and R52 force the inverters used in the oscillator to operate in their linear region. The waveform at pin 5 of a third inverter Z42 is a sign wave at a frequency of 10.6445 MHz. The output of the oscillator, however, should not be measured at this point due to the loading effect test equipment may have at this node. The measurement point is pin 6 of the inverter Z42 which is the output of the oscillator. The output of the clock (note the CLOCK signal) couples to the timing circuit for the CPU, to the video divider chain 28, and to the video processing circuit 24.

CENTRAL PROCESSING UNIT (CPU)

FIG. 14A shows the microprocesser Z40 which is a Z80 central processing unit MK3880. This is a conventional device that may be purchased by any one of the well known companies making such devices such as Motorola, Fairchild, or Texas Instruments. This microprocessor has the capability of 158 instructions with total software capability. It contains 22 internal registers and has three modes of fast interrupt and additionally a non-maskable interrupt. The unit directly interfaces with standard speed, static or dynamic memories with little interconnecting logic. The processer has a 1.6 micro-second instruction execution speed and operates from a single 5 volt supply with a single phase 5 volt clock. FIG. 14A clearly indicates the connections to and from the microprocessor including the address lines and the data lines. Throughout the description the address lines are identified as A0–A15 while the data lines are identified as lines D0–D7.

CPU TIMING

As previously indicated, the microprocessor Z40 requires a single phase clock source for operation. The basic clock frequency of 10.6445 MHz is applied, as indicated in FIG. 14A, to a standard ripple counter Z56 at pin 1. The device 56 may be a conventional divide-by-12 counter connected to provide a divide-by-6 count. For example, this may be a device 74LS92 providing at its output pin 8, a signal or frequency of about 1.774 MHz. This signal is applied to the input of inverter Z72 A. The output of this inverter is coupled to pin 6 of the microprocesser Z40 identified as its $\overline{\text{O}}$ input or clock input. Resistor R64 pulls up the output of inverter Z72A and it insures a rapidly increasing rise time for the clock signal. Note that the enable input of inverter Z72A is tied to ground. Inverter Z72A is thus an enablable gate; since the enable input is tied to ground, this gate is always active enabling passage of signals therethrough. The clearing of the counter Z56 is at pins 6 and 7. When one or both of these pins are at a low voltage level, the counter operates normally, when either pin goes to a high level the counter is cleared or reset. Note the inverter Z42 coupled to inputs 6 and 7 of counter Z56 is used to disable counter Z56 during automatic testing of the system. Resistor R67 pulls the input to inverter Z42 to a positive voltage which causes the output of the inverter to stay at a logic low level. However, during testing the input of this inverter may be selectively pulled to a low logic level thus disabling and clearing the counter Z56. With regard to the CPU timing, the device Z72 may be a 74LS367 while the device Z42 may be a 74LS04. Usually a plurality of such inverters are provided per device. In this connection the designation, such as inverter Z42, may pertain to other inverters shown in the description, but each inverter can be specifically identified by its input and output pin numbers or by a designation system such as Z42A, Z42B etc.

POWER-UP-CLEAR AND SYSTEM RESET

As mentioned previously in connection with the description of FIG. 1, upon power-up the CPU accesses known address in the ROM for instructions. The circuitry which causes the starting address output is shown in FIG. 14A as including gate Z53A, and inverter Z52A. Gate Z53A may be a two input NAND gate 74LS132 drawn, however, as an inverted input OR gate. When power is first applied to the system, capacitor C42 is discharged. Upon application of power, capacitor C42 is charged through resistor R47 at a predetermined rate. During the initial charging of capacitor of C42, the output of gate Z53A is high. This high signal is inverted by gate Z52A to provide at the output thereof a low signal which is applied to pin 26 of the microprocesser Z40. A low at input terminal 26 to the microprocesser forces the microprocesser to output the starting address ∅∅∅∅ on its 16 address lines A0–A15 (ZA00–ZA15). When capacitor C42 charges past about 1.4 volts, the gate Z53A has a low level on its output which causes the output from gate Z52A to revert to its high level. The CPU is now out of its reset state and will start executing instructions from the ROM, starting at address ∅∅∅∅. Thus, the pin 26 to the microprocesser is low for only a few milliseconds after power is applied. Once capacitor C42 charges past its threshold level, this reset input to the microprocesser stays at a high level until capacitor C42 is again discharged when power is removed. It is noted that the gate Z53A, although implemented as a NAND gate is functionally shown as an OR gate having inverted inputs. The "not" circles at the input indicates that the gate is looking for a signal that is low to cause an output that is high. Had the gate been drawn as a NAND gate, it would not have been as obvious that the output is active when high. This functional type of logic symbolization is used throughout the schematics.

In FIG. 14A, above the reset circuit, there is shown a somewhat similar circuit including switch S2, gate Z53B and gate Z37A. Switch S2 is a reset switch. The circuitry associated with the reset switch includes capacitor C57 and resistor R65. It is noted that capacitor C57 has a smaller value than the capacitor C42 shown therebelow. Hence, capacitor C57 charges up faster than capacitor C42 assuming that capacitor C57 has charged in that the pin to input gate Z53B is high, the output from this gate will be in its low state and the output of gate Z37A will be at its high state. With the input at pin 17 to the microprocesser held high, the microprocesser is operable. If switch S2 is pressed, capacitor C57 discharges through the switch. The resulting low level signal is applied to a second input gate Z53B and the output of gate Z53B goes to its high level. Gate Z37A, at its output is then forced low. A low at pin 17 of the CPU forces the microprocesser to restart at address ∅∅66. When switch S2 is released, resistor R65 begins to charge capacitor C57 until a logic high level is applied to pin 1 of gate Z53B. At this time pin 17 of the CPU goes back to its high level and the CPU starts executing instructions from address ∅∅66 in the ROM.

Switch S2 is used to essentially reset the microprocesser when it is "lost". The operation of this switch forces the CPU to a known address to enable it to get on the right track. An example of a CPU that would be "lost" might occur during a bad cassette load attempt. If a cassette is loading and suddenly there is information missing on the tape caused possibly by dirt or age of the tape, the recorder may never stop. Switch S2 may then be pressed, which directs the CPU out of the cassette load routine and back into its ready mode.

Associated with the reset circuit including switch S2 is the HALT output at pin 18 of the microprocessor to the second input of gate Z53B. For most application in the basic system, the output from pin 18 is always high. It does to its low level only when a software HALT instruction is generated by the microprocessor Z40. Usually, such an instruction is not included in the read only memory. However, there is a possibility that pin 18 of the microprocesser could go to its low state due to some malfunction. In such a case, switch S2 is not effective to reset the CPU and about all that can be done is to shut down the computer and restart power.

The output from gate Z53B, also couples to pin 3 of gate Z37B. The output from gate Z37B is referred to as a system reset (SYSRES). This signal is normally high and only goes to its low level during power-up or when switch S2 is pressed.

When power is interrupted or turned off to the system because of a "lost" CPU, the operator should wait at least 10 seconds before power is reapplied. If this period is not waited, capacitor C42 may not discharge sufficiently and thus the CPU may not revert to address ∅∅∅∅ during a restart. By waiting, capacitor C42 discharges sufficiently and thus upon power-up, the system will start at the correct ROM location.

CPU FUNCTIONS WAIT, INT, TEST

The microprocesser Z40 has three inputs identified as WAIT (wait), INT (interrupt) and BUSRQ (bus request). All three of these inputs are pulled up by respective resistors R51, R50 and R58. These inputs are active on a low input signal and thus when there is no input signal the resistors maintain these inputs inactive.

The WAIT input, pin 24 of microprocesser Z40, slows the CPU down if there are slow memories that it is accessing. If this line goes low, the CPU goes into a WAIT status until it goes back to its high level. Once this signal is high, the CPU continues with the operation. For example, assuming that there is a memory system that takes 100 microseconds before address data can be guaranteed to be present at the output, when the memory logic sees that the CPU wants data, it will force the WAIT line low. At the end of the 100 microsecond interval, the logic will make the WAIT input high, and the CPU will input the data.

The INT (interrupt request) signal is provided at pin 16 of the microprocesser Z40. This input, when low, forces the CPU into an interrupt request section of the memory. It then performs an instruction associated with the interrupt. An example of this is as follows. Assuming that a door on the back of the computer should always be closed, there is a switch provided connected to the door, such that when the door is opened, the switch contacts are shorted. The switch connects between ground and pin 16 of the microprocessor. If the door is opened, the computer is interrupted and there is printed on the screen the indication of the open door. The CPU is interrupted until the door is properly closed.

The TEST input is useful in trouble-shooting. Pin 25 of the microprocessor is labeled BUSRQ (bus request). When pin 25 is brought low, it forces the data, the address and the control lines into a disabled or floating state. Although this function may not be used in normal operation, it is quite useful when someone desires to shut down the CPU to test other portions of the system.

CPU ADDRESS BUS

FIG. 14A shows the address bus 12 comprised of address lines A0–A15. Because these lines couple to all other components of the system such as the keyboard and the random access memory, these lines are buffered for at least two reasons. First, the buffers must be able to supply the address bus with proper logical levels. The microprocesser cannot supply the current necessary to drive all the sections connected to the address bus, and buffers are needed for current gain. Secondly, it may be necessary to switch off the address bus. For example, if an expansion interface is connected to the bus, it may be necessary to address the RAM in the main unit for a data transfer. Therefore, there must be some method to take the CPU off the data bus. The buffers are tri-state devices such as the conventional 74LS367. This essentially means that they will either act as a buffer or as an open switch. Gate arrays Z38, Z39 and part of Z22 and Z55 form the address line buffers. It is noted in the gates Z38 and Z39 there are essentially two sections of buffers. The first section contains four buffers and the second section contains only two buffers. Each section is controlled by a single pin. The first is controlled by pin 1 and the second by pin 15. When these control pins are at a logic low level, the buffers are enabled and will operate normally. When the control pin is at a high logic level, the buffers are disabled and will show a high impedance from input to output. The signal that controls the address buffers is defined as the ENABLE signal and has its source at gate Z52B. The input of this gate is tied to the TEST line. The resistor R58 keeps this line high under normal operation. Hence, the control line for the address buffers is usually at a logic low level permitting operation of the buffers. If the test line is shorter to ground, the address buffers are disabled. This feature is useful in trouble-shooting.

CPU DATA BUS

The data bus 14 is buffered similarly to the address bus 12. There are only 8 data lines at the CUP identified as lines D0–D7. However, there are 16 buffers because the CPU must receive data as well as send data. The address lines on the other hand are strictly outputs from the CPU. There are therefore two sets of buffers for the data lines, one set for handling output data from the CPU while the other set handles input data to the CPU.

The output data buffers comprise all of the gate array Z75 and one section of the array Z76. The input buffers on the other hand comprise one secton of the gate array Z55 and the other section of the gate array Z76 (three gates). The input and output buffers are connected "head-to-toe". This could cause a problem if both were active at the same time, however, the control inputs to the buffers are controlled so that this does not occur. The control inputs to the output buffers are all connected together on the line labeled DBOUT* and are in turn tied to gate Z53 pin 6. The input buffer control line is identified by the signal DBIN*. This line connects from the output of gate Z53C. The signals DBIN and DBOUT are essentially mutually exclusive.

The output from gate Z53, pin 6 provides the major control. If this output is high, the signal DBOUT* is high and the signal DBIN* is low. Therefore, the input buffers are enabled and the output buffers are disabled. If the gate Z53, pin 6 is low, then the signal DBOUT* is low and the signal DBIN* is high. In this case, the output buffers are enabled and the input buffers are disabled.

Pin 4 of gate Z53 which is a NAND gate is tied to the TEST* signal. If the signal TEST* is low, the address buffers are disabled and also the output pin 6 of gate Z53 goes high. Hence, the data output buffers are disabled, robbing he CPU's control over the data lines. Because the signal DBIN* is now held low, the input data buffers are active, but, this does not cause any problem since the address bus from the CPU has been disabled. When the signal TEST* is left alone, in its high state and if pin 21 of the CPU (the memory read output) is high, pin 6 of gate Z53 goes to its low state. This low signal causes the signal DBOUT* to be low and the signal DBIN* to be high. Therefore, the CPU is outputting data and the buffers are switched accordingly. When pin 21 of the microprocesser goes to its low state, pin 6 of gate Z53 is high. This is almost the same condition as if the signal TEST* went low. The signal DBOUT* is high and the signal DBIN* is low but the address buffers are still enabled. The data buffers are now ready for the CPU to accept the data. Thus, it is the read output RD* that primarily controls the inputting and outputting of data on the data bus.

CPU CONTROL GROUP

Having now identified the address lines and the data lines associated with the CPU, we can now consider the CPU control group. The data bus is used to gather data into the CPU or to pass data out of the CPU. The control group functions determine how the CPU stores data in a memory or how it tells ROM or RAM that it is ready to receive data. The control group functions include signals RD, WR, OUT, and IN.

RD (READ)

FIG. 14A shows the control signals generated from the CPU including the read signal RD*. This signal, when activated, will tell other sections of the system that the CPU is ready to accept data. The RD* signal is generated at gate array Z23, pin 6. Pin 5 of the same gate is connected to pin 21 of the microprocessor which is the RD* (read) output of the microprocesser. Pin 4 of gate Z23 is tied to pin 19 or the memory request output of the CPU. Therefore, when both signals on lines 19 and 21 from the microprocessor go to their low level an RD* signal is provided at the output pin 6 of the gate array Z23. Again, this array is shown as an AND type gate and actually a straight OR gate is used and it is drawn like an AND gate with inversions at all terminals rather than a straight OR gate, the both being equivalent, to indicate that when the memory request and the read signals are present from the microprocesser, then and only then will the read signal appear. Thus, a low input on both pins 4 and 5 of gate Z23 provides a low output on pin 6, the low indicating a read.

WR (WRITE)

The signal WR denotes a write control. This signal, when activated, indicates to other sections that the CPU is ready to transmit data into one of the memory locations. The WR* signal is generated at gate array Z23 pin 11. Pin 12 of this gate is connected to the memory request of the microprocesser while pin 13 of the same gate is tied to the write output signal from the processer. Again, when there is a low on pin 19 of the processer indicating a memory request and when there is a low on pin 21 of the microprocesser indicating a write portion of the signal, then and only then is there a low output on signal line WR* thus indicating a write portion of the memory cycle.

OUT (OUTPUT)

The signal out is for output control. This signal, when activated, enables circuitry to perform the cassette save functions. It may also be used to control data movement from the basic computer system to an expansion interface. This signal is generated at gate Z23, pin 3. Pin 1 of gate Z23 is tied to the write output of the CPU while pin 2 of this gate is tied to the IORQ (input/output request) output which is pin 20 from the CPU. When there is a low on line 22 from the CPU indicating a write signal and a low on pin 20 from the CPU indicating an input/output request, then and only then is there a low signal on pin 3 from gate Z23 generating this signal OUT*.

IN (INPUT)

The IN signal is for input control. This signal, when activated, enables circuitry to perform the cassette load function discussed in detail hereinafter. It may also be used to control data movement from an expansion interface to the basic computer system. The IN signal is generated at gate array Z23, pin 8. Pin 10 of this same gate is connected to the pin 20 of the CPU while pin 9 of the gate is tied to pin 21 of the CPU. Again, when there is a low at pin 21 of the CPU because of a read portion of the cycle, and when there is also a low signal at pin 20 of the CPU, then and only then is there a signal at the output pin 8 from the gate array Z23 which is the IN* signal.

CONTROL GROUP BUS

The control group signals just previously discussed are buffered for use by the different sections of the system. As part of this buffering system, the control group bus may also need to be switched off at some time. Therefore, there is provided a part of the gate array Z22 which may be a 74LS367 including four tri-state devices. It is this array Z22 that is used to buffer the control group signal. Tri-state control is provided at line L1. This control is tied to the address bus control. The ENABLE* signal effects the status of the address and also the control group bus in the same manner.

ADDRESS DECODER

Figure 14B:
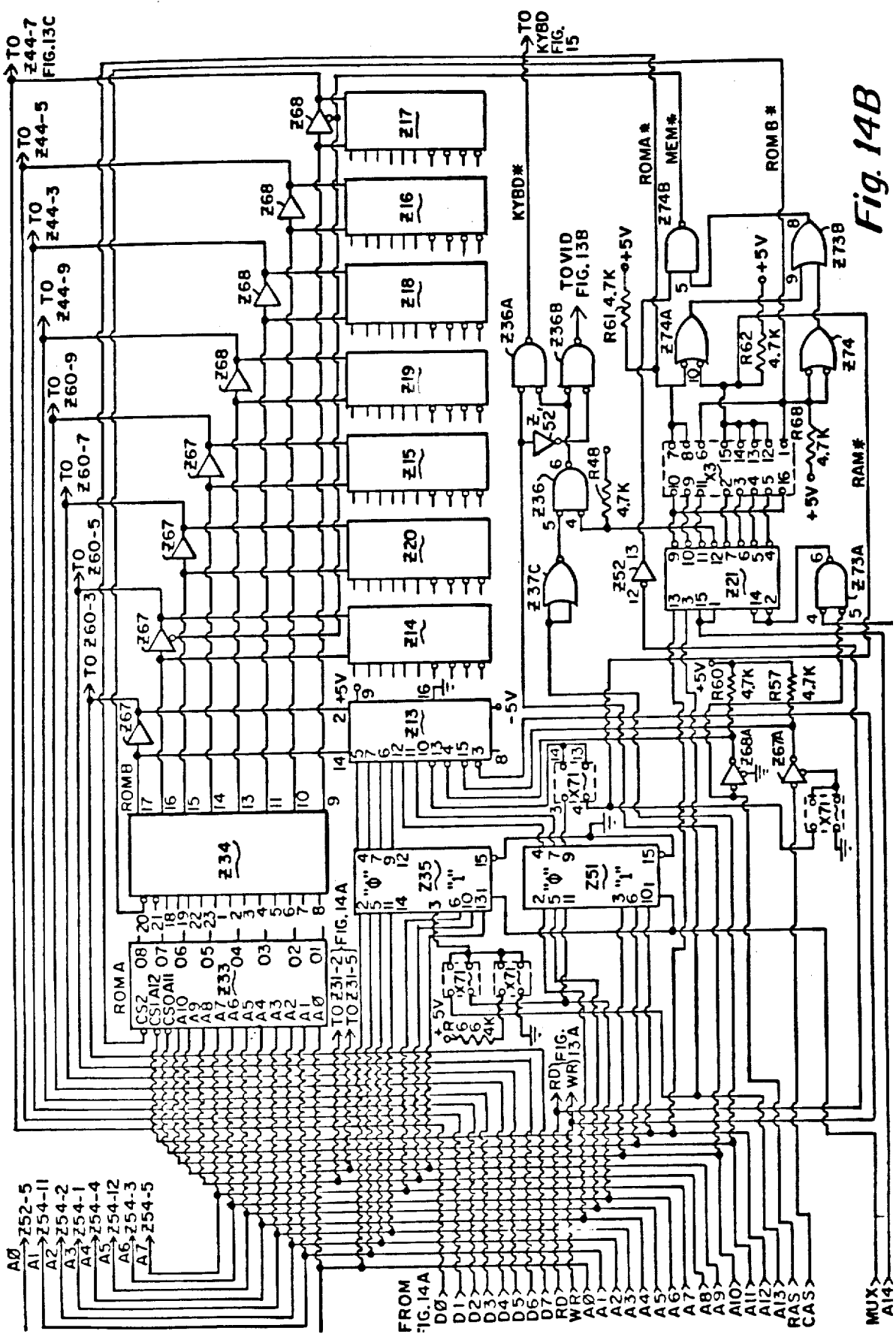

As mentioned previously in connection with the diagram of FIG. 2, the computer system is memory mapped. Therefore, the address ∅1AC (in HEX) is in the ROM portion of the map. Address 38∅A is in the keyboard area and address 3CAA accesses the video display RAMs. Please also refer to the chart of FIG. 3. Since the data and address buses are connected in parallel to all the sections, there must be some way to determine which section is being accessed. A decoding network monitors the higher order address bits and selects which "memory" the CPU wants to use. FIG. 14B shows the address decoder. In this connection please also refer to the table of FIG. 3. In FIG. 3 it is noted that one could use the two most significant digits of the HEX code in the decoding scheme and handle the selection of all memories. In the binary columns, one can see that instead of using two HEX digits, which is 8 binary lines, two bits can be ignored and thus only 6 binary lines are used. A dotted line separates the two unused bits from the 6 that are used.

The address decoder depicted in FIG. 14B uses 6 bits, namely A10–A15, and, in addition, the signals RD* and RAS* (row address select). The address A15 is the most significant bit of the address bus. The 6 higher order bits can have two bits added thereto so that we have two HEX digits A12–A15 forming the most significant HEX character and A8–A11 forming the next most significant HEX character. Addresses A8 and A9 are the two bits added to complete the last HEX character. FIG. 3 shows the breakdown of the memory map into HEX and binary.

With reference to FIG. 14B the address decoder comprises device Z21 which may be a device type 74LS156 decoder/demultiplexer. This device is arranged to multiplex two inputs to provide eight different output signals. In addition to the decoder Z21, the address decoder also comprises other decode gates discussed in detail hereinafter. Address bits A12, A13, and A14 are connected to decoder Z21. The C1 and C2 inputs (pins 1 and 15) are connected in such a way to make the decoder Z21 into a three input to eight line decoder. The G1 and G2 inputs (pins 2 and 14) to decoder Z21 are chip enables. When these G1 and G2 inputs are at a logical low level, the decoder Z21 is active. When these inputs are high, the decoder Z21 is disabled and none of its eight output lines are low. This enabling input to the decoder Z21 is controlled by gate Z73A pins 4, 5 and 6. Pin 4 is tied to address line A15, the most significant bit of the address bus. It is noted in the memory map breakdown that address line A15 is always low when addressing the various memories. The pin 5 of gate Z73A is tied to signal RAS*. This signal is generated from the memory request output of the CPU at pin 19 passed by way of gate Z72B shown in FIG. 14A This buffer source generates RAS* and it is the same signal essentially as MREQ*. When the signals A15 and RAS* are both low at the same time, a low signal will be outputted from pin 6 to the decoder Z21. This low signal enables the decoder. When the decoder Z21 is in its enabled state, one of its outputs will go low depending upon the code on the address lines A12, A13 and A14. For example, if these three inputs are at logical zero, pin 9 of the device Z21 is at a low state and all other output pins are at a high state. Thus, it is a low level at the output that is the decoded signal. If all three inputs at A12, A13, and A14 are high, then pin 4 at the output is low. One can consider the code at A12, A13 and A14 as supplying an octal address to the decoder Z21. Since there are eight states in an octal code, then there would be one of eight lines selected. Thus, the decoder Z21 decodes the most significant digit of the HEX address. Then, with the use of the last two address bits A10 and A11 one can define any one of the four memories available to the CPU. These four memories include the RAM, ROM, keyboard, and video. Associated with the decoder 21 is a programmer in the form of a simple device X3 referred to as a DIP shunt. This device is like a shorting bar array with some of the bars being shorted and others left open. In this manner the address decoder is programmed to reflect the amount of RAM or ROM the CPU has available for use. In FIG. 14B device X3 is shown with six open shorting bars and 2 closed shorting bars. This configuration will be used in the following discussion.

ROM DECODING

When the CPU needs an instruction in order to perform a certain task, the CPU accesses the read only memory 16. This accessing of the ROM again involves address decoding and the decoder Z21 as shown in FIG. 14B. The ROM decoding is performed as follows.

The CPU requires a memory and thus the signal RAS* goes to a low level. From FIG. 3 the address for the ROM starts with HEX 0 with address lines A12, A13, A14 and A15 all at a low level. The decoder Z21 is activated at its inputs G1 and G2 (pins 2 and 14) by the proper signals A15 and RAS*. The decoder Z21 with all inputs low provides a low output on pin 9. This output couples through the device X3 pins 10 and 7, past the pull-up resistor R61 and out to a terminal identified as ROMA*. This signal couples to ROM A. In particular, this signal couples to pin 20 of ROM A. Pin 20 (CS2) is the chip select input and is active on a low signal (as the inverted circle on pin 20 shows). Thus, the ROMA* signal turns ROM Z33 on which means that its output becomes active. In this connection note that the outputs from both ROMs couple to tri-state buffers Z67 and Z68. When the input chip select signal on pin 20 goes low, the outputs from the ROM switch from a high impedance or off state to an on state. When the ROM is thus enabled, the outputs go low or high depending upon the data in the ROM at the address that has been selected. In this connection, also note the address inputs to the ROM including addresses A0–A12.

With one of the read only memories being selected, such as ROM A, there is now a need to insure a data path so that data can pass from the ROM to the CPU. In FIG. 14B the signal ROMA* is also coupled to one input of NAND gate Z74 (gate Z74 is shown as the equivalent OR gate with inverted inputs). A low at the input of this gate causes a resulting high on its output. This signal is coupled to pin 9 of gate Z73B which is an OR gate. The output at pin 8 at Z73B passes a high level signal to pin 5 of the NAND gate Z74B. The other input to this gate is tied to the RD* signal now part of the CPU control group by way of the inverter Z52, pins 12 and 13. Because the CPU is trying to read data from the ROMs RD* is low but the other input to gate Z74B is high because of the inversion by inverter Z52. Thus, the output from gate Z74B is a low level signal identified as signal MEM*. As indicated in FIG. 14B this signal controls the ROM/RAM buffers (gate arrays Z67 and Z68). The outputs of these buffers are tied to the data bus 14. The enabling of these buffers by the signal MEM* permits data to be coupled from the ROMs to the data bus. This data flows to the CPU because the CPU is signalling a read portion of the cycle. Because this is to, the signal DBIN* is low and the signal DBOUT* is high. The low signal DBIN* enables the input data buffers to the CPU making data from the ROM available at the CPU.

KEYBOARD DECODING

The keyboard 20 is identified address-wise from address 3800 to address 380F (see FIGS. 2 and 3). In the system of this invention the keyboard is considered as a memory device and thus when there is a memory request from the central processing unit, the signal RAS* is low. The keyboard decoding is also associated with the decoder Z21 previously discussed and shown in FIG. 14B. In the decoding scheme for the keyboard the signal A15 is low because we are generating address codes under 8000. With reference to FIG. 3 it can be determined that address line A14 is low while address lines A12 and A13 are high. With this input combination and with decoder Z21 being activated at its terminals G1 and G2, there will be a low decoded output at pin 12 (output 3). This output is coupled to gate Z36 pin 4. The gate Z36 is also looking for a low output at its pin 5. Again, referring to FIG. 3 the address line A11 is high and this signal is inverted by the gate Z37C thus providing a low level signal on pin 5 of the gate Z36. Under this condition the output pin 6 from gate Z36 is also low thus essentially enabling both gate Z36A and gate Z36B. However, only one of these gates will be active depending upon the state of address line A10. Again, referring to the table of FIG. 3 for keyboard decoding, the address line A10 is low. Hence, both inputs of gate Z36A are low and there is provided a low signal on its output identified as the KYBD* signal.

The signal KYBD* is shown in FIG. 14B coupling to the enable inputs of the data buffers Z3 and Z4 for the keyboard. The lower order address lines A0–A7 are coupled by way of buffer arrays Z1 and Z2 to one side of the keyboard matrix, while the other side of the matrix is tied by way of buffer arrays Z3 and Z4 to the data bus including data lines D0–D7. If a key is pressed, an address line is "shorted" to a data line. A further discussion is found hereinafter on the keyboard operation. In transmitting the data from the keyboard, the signals DBOUT* and DBIN* shown in FIG. 14A are switched the same way as previously discussed with regard to ROM selection. Therefore, keyboard data is coupled to the CPU via the data bus for processing by the CPU.

VIDEO DISPLAY RAM SELECT

From the table of FIG. 3 it is noted that the binary output for the video RAM address is almost the same as for the keyboard with the exception of the state of address line A10. As with the keyboard decoding, the output of decoder Z21 has its low level on pin 12 which couples to pin 4 of gate Z36. The address line A11 is high and thus the output from gate Z36 at pin 6 enables both gates Z36A and Z36B. However, now rather than the output of gate Z36A going low, the output of gate Z36B will go low because the address line A10 is now high and this high level signal is now inverted by the inverter Z52 to thus provide two low level signals on the outputs of gate Z36B. Hence, the output of gate Z36B is low generating the signal VID*. This activates the video RAM. There is a further discussion hereinafter with regard to this video RAM selection.

4K RAM DECODER

In the system of this invention there is also communication between the CPU and the random access memories. As indicated in FIGS. 2 and 3, the address which selects the RAM extends from HEX 4000 to 4FFF for a 4K memory. The binary breakdown shown in FIG. 3 lists the state of A15 as a binary zero. Furthermore, address line A14 is high while address lines A12 and A13 are low. Memory is still being accessed and thus the signal RAS* is low. Hence, the decoder Z21 is activated and because of the input address there will be a low output on output pin 7 (output 4). The shunt X3 passes this low through pins 2 and 15 to gate Z74, pin 10. This signal is also outputted directly as signal RAM*. This signal is a signal that provides a chip enable for the RAMs.

During a read operation the buffering provided by gate arrays Z67 and Z68 in FIG. 14B is controlled so as to couple data to the CPU. Thus, in that portion of the memory cycle the signal MEM* is low because RD* is low. However, during a transfer of data from the CPU to the RAM, the signal MEM* does not select the data buffers. Instead, the write signal is active rather than the read signal and these ROM/RAM buffers Z67, Z68 are not used because the RAM data inputs are on the opposite side of these buffers. Thus, only during a ROM/RAM read operation is the signal MEM* necessary.

With regard to the shunt X3 and the output of the decoder Z21, this shunt can be adjusted to program the system for 8K of RAM rather than 4K. This is accomplished by providing a short between both pins 2 and 15 and 3 and 14. In this way, not only would a 4∅∅∅ address cause signal RAM*, but also a 5∅∅∅ would also enable the signal RAM*. For 12K of RAM, we could leave also pins 4 and 13 shorted together and for 16K of memory we can, in addition short pins 5 and 12. For the 16K memory thus, the signal RAM* would be active from addresses 4∅∅∅ to 7FFF.

With regard to the discussion of the shunt X3, it is noted that certain outputs of the decoder Z21 are shorted together. In many applications, shorting output nodes is not good practice. However, in accordance with the present invention using TTL logic, open collector types are used. These types of gates do not have an active pull-up on the output. Instead, the output transistors have open collectors. It is the responsibility of external circuitry to pull them up. The open collectors are capable of being tied together for a wired OR function. Since decoder Z21 is an open collector decoder, the outputs may be safety tied together. In this connection, note resistors R48, R61, R62 and R68. These are pull-up resistors for the decoder Z21.

SYSTEM RAM

With reference to the block diagram of FIG. 1, the system RAM 18 is essentially tied in parallel with the data bus 14 and the address bus 12 similarly to the ROM 16 and the keyboard 20. The data input and output for the RAMs 18 shown in FIG. 14B are controlled by the signal MEM* which couples to the gate arrays Z67 and Z68. With regard to the addressing scheme for the RAMs for 4K addresses, one would expect to find 10 address inputs. However, in accordance with one important feature of the present invention, there are provided only 7 address inputs used in combination with a multiplexing scheme. In this regard, the address from the CPU is multiplexed into the RAM in two 7 bit parts. The internal logic in the RAM interprets the two parts and essentialy ties them together to form one address scheme with a total of 14 bits. One part of the addressing is called RAS* (RAM address select); the other part being called CAS* (column address select). Another signal identified in FIG. 14B as the MUX (multiplexer) signal controls the switching function. All three of these signals are generated from the logic shown in FIG. 14A.

MUX CAS* RAS*

Figure 4:
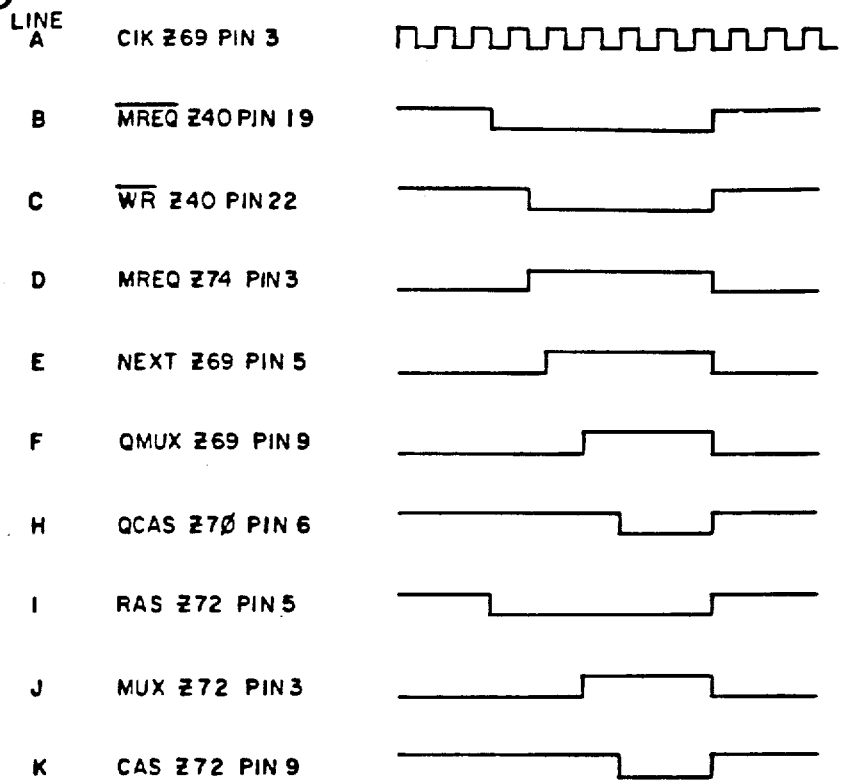
FIG. 4 is a waveform chart associated with circuitry in FIG. 14A.

The logic for developing the signals for controlling the addressing at the system RAM include the series of flip-flops shown in FIG. 14A including two flip-flops Z69A and Z69B and one flip-flop Z70. The basic inputs to this logic include the clock signal and signal MREQ at the output pin 3 from gate Z74. The two outputs at pins 21 and 22 from the microprocesser Z40 connect to the input pins of the gate Z74. If there is a low on either of these pins from the CPU, there is a high output at pin 3 from the gate Z74. Thus, there is essentially a memory request and there is either a read or a write signal from the microprocessor. The signal MREQ is tied to the clear inputs of the flip-flops Z69A and Z69B and part of Z70. These flip-flops are D type flip-flops and the signals MUX and CAS* are generated from these flip-flops. FIG. 4 shows a waveform chart or timing diagram for this circuit. Line A shows the master clock input to the flip-flops. Line B shows the signal MREQ* and line C depicts the WR* output from the CPU, assuming the CPU wants to write data into the RAM. As depicted in FIG. 4 the signal from pin 19 of the CPU goes low first. A short time later, the write signal from the CPU goes low. Line D shows the output pin 3 from the gate Z74 which goes high at the same time that the write signal went low. The flip-flops now have a logical high applied to the clear inputs permitting these flip-flops to operate controlled by the clock waveform. On the next rising edge of the clock, the flip-flop Z69A of pin 5 will assume the logic level that was present at its data input pin the time that the clock occurred. Since the data input was high when pin 3 went high, then pin 5 will also go to its high state. This high signal is shown on line E of FIG. 4. This signal is also coupled to pin 12 (data input) of the second flip-flop Z69B which is also now high; so that on the next rising edge of the clock its output pin 9 will go to its high state. This is shown on line 5 of FIG. 4. The last flip-flop Z70 is now ready to toggle. On the next rising edge of the clock Z70, pin 6 will go to a low state. This signal is shown on line H of FIG. 4. Now, all three flip-flops have changed state since the write signal from the CPU went low. The flip-flops will stay in this state so long as the write signal from the CPU stays low. When the signal from the CPU goes high, the flip-flops will have a low applied to their clear input; and they will reset back to the clear condition. Line I is the RAS* output. This output is a direct function of memory request output at pin 19 from the CPU as buffered by the gate Z72B. The gate Z72B is enabled at pin 1 by the ENABLE* signal. Line J in FIG. 4 shows the MUX signal which has its origin at the output pin 9 of one of the flip-flops Z69B coupled through buffer Z72D. Line K in FIG. 4 is the CAS* signal and this is buffered by the gate Z72C, coupled from the output pin 6 of flip-flop Z70.

In summary, the following sequence of events occurs with regard to the diagram of FIG. 4. RAS* goes low first, MUX then changes state. CAS* then changes state one clock cycle later. Thus, we first get a RAM or row address select, then the multiplexing signal MUX, followed by the column address select. Hence, the first part of the address will be the row address followed by a switching or multiplexing to the column address.

RAM ADDRESSING

Data selector/multiplexers Z35 and Z51 shown in FIG. 14B control the addressing to the RAMs. Both of these devices may be 74LS157 devices. These devices have two groups of inputs of either 3 or 4 lines and an output of either 3 or 4 lines depending upon how they are connected. With regard to device Z35 two groups, each of four lines and one group of four is labeled "∅" and the other labeled "1". The device Z51 is configured similarly except that there are only three lines per group. The "∅" tells us that when the select pin, which is pin 1 in each device is low, the multiplexer will be outputting data associated with these input lines. On the other hand the "1" tells us the multiplexer will be outputting data associated with the other group of lines. The device Z35, therefore, operates like a four pole double throw switch where the select input at pin 1 is performing the switching. The enable input to these selectors or multiplexers is pin 15. Since pin 15 is permanently grounded, these devices are always enabled.

READING FROM RAM

Assume that the CPU requires RAM data. The following discusses the addressing and data paths employed with a 4K random access memory. The cycle commences by the CPU outputting the signals on its lines 19 and 21. The address decoder outputs the signals MEM* and RAM*. The signal MEM* activates the RAM/ROM data buffers and the signal RAM* enables the chip select input for the RAMs on pin 13. At the same time the multiplexer loads the address into the RAMs. The signal RAS* goes low as depicted in FIG. 4. The MUX signal is low at this time, so the inputs A0-A5 on the RAM receive the lower order address by way of pins 2, 5, 11 and 14 of the device Z35. The signal RAS* is buffered by gate Z68A, and is applied to pin 4 of all of the RAMs depicted in FIG. 14B. The negative going signal at this input pin 4 loads the lower order address in the row selection of each RAM. A short time later the MUX signal changes state going high as depicted in FIG. 4. The multiplexer comprising devices Z35 and Z51 now switches and the higher order addresses are applied to the RAMs. The signal CAS* goes low. CAS* is applied to the buffer gate Z67A. The output of this gate passes the signal CAS* to pin 15 of all eight RAMs. On the negative transition of signal CAS*, the high order addresses (A6-A11) are loaded in the columned section of each RAM. Four of these addresses are coupled by way of device Z35 and two are coupled by way of device Z51. The RAMs now have the entire address from the CPU. The RAM now outputs this addressed data through the associated buffers to the CPU.

WRITING TO RAM

During a data write cycle, the CPU sends data to the RAMs. Hence, the ROM/RAM buffers are not employed and it is not necessary for the signal MEM* to go low. Instead of the CPU issuing a read command, it issues a write instruction. Thus, the signal WR* is tied to all 8 RAMs on pin 3. When this pin is low, data is stored in each RAM at the specified address. When this pin is high, the RAMs are in a read cycle.

REFRESHING THE RAMS

The computer system of this invention uses a dynamic type RAM. A dynamic RAM differs slightly from a static RAM in data retention. A static RAM retains data stored in it so long as power is applied to the system. A dynamic RAM on the other hand requires periodic addressing to insure that it retains the data loaded into it. This periodic addressing is called refreshing. The refreshing of the RAMs is accomplished by the RAS* signal. When this signal goes low, all of the individual RAMs in the system will refresh themselves even though they may not be in use at the time. As mentioned previously, the signal RAS* is generated by the CPU at pin 19. When pin 19 goes low, RAS* goes low and the RAMs will load the lower order address into the row section. The CPU may be looking at system ROM when pin 19 goes low, but the RAM will still receive the signal RAS* and hence be refreshed. In a system of this invention the RAM should be refreshed once every two milliseconds.

RAM PROGRAMMING

Associated with the RAMs is a shunt X71 shown in FIG. 14B. This is used to program the size of the memory in the system. Pin 13 on the RAMs is a chip enable and this couples to one section of the shunt X71. In a 4K system, pins 4 and 13 of shunt X71 are shunted. The signal RAM* is on pin 4 so this signal is used to select the RAMs. However, in a 16K system, pins 4 and 13 are opened and pins 3 and 4 of the shunt X71 are shorted. Thus, instead of the signal RAM* there is the address lines A6 or A12 depending upon the multiplexer condition.

VIDEO DIVIDER CHAIN

The video divider chain shown in FIG. 13A supplies the video RAMs 22 with addresses in a logical order for video processing. This chain also supplies the horizontal and vertical sync timing pulses so that the video processer can build the composite waveform for the display. Video RAM addresses, horizontal and vertical sync, and video processing timing are all direct functions of the master clock. Also included in the divider chain is the hardware necessary to generate 32 character line lengths.

DIVIDER CHAIN - INPUT CONDITIONING

In accordance with one important feature of the present invention, the computer system has two formats for character length. In one format, the display has 16 character lines, each consisting of 64 characters. This means there are 1024 character locations in video RAM that the divider chain must access. In the other format, the characters appear twice as large. The display has 16 character lines of 32 characters rather than 64 characters. In this case the divider chain accesses only 512 video RAM locations. Switching from one format to the other is the task of the input conditioning logic shown in FIG. 13A.

In FIG. 13A the master oscillator circuit couples to a flip-flop Z70 at pin 11 and also to a multiplexer Z43 which may be a 74LS157 device. The conditioning circuitry also includes a divider Z58 which may be a divide by 12 divider. This divider may be a 74LS92 device. The D flip-flop Z70 is wired to perform a divide-by 2 function. The multiplexer is wired so that one can route the master clock frequency or one-half of the master clock frequency from the flip-flop Z70 to the divider Z58. Since there are two character length formats there are two reference frequencies, one that is half as slow as the other. The master oscillator supplies the divide-by 12 counter Z58 as a reference frequency in a 64 character format. The D flip-flop supplies the counter with the reference frequency in a 32 character format.

Figure 5:
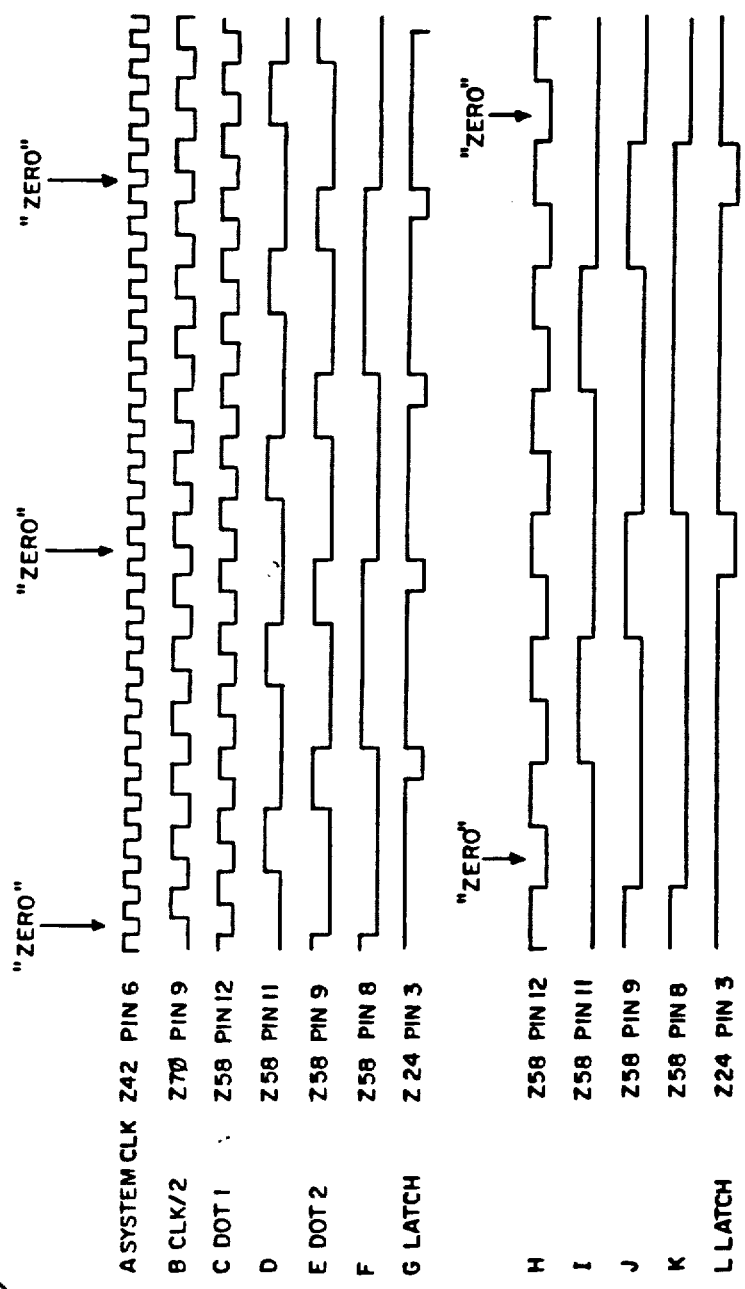
FIG. 5 is a timing diagram associated with the video processing section of the system.

The multiplexer Z43 is of the same type previously discussed as devices Z35. The multiplexer Z43 is controlled by the signal MODE SEL. When the mode select signal is low, the multiplexer Z43 is switched to its 32 character position. When this signal is high, the multiplexer is switched to its 64 character position. First, the 64 character mode is analyzed. For this mode of operation, with the mode select signal high, pin 3 of the multiplexer couples to the output pin 4. Similarly, pins 6 and 7 are intercoupled and pins 10 and 9. FIG. 5 is a waveform chart from this circuit. At line A in FIG. 5, the master clock is shown at the output of its buffer gate Z42, pin 6. Line B shows the action of the D flip-flop Z70 with its divide-by 2 output. The buffered clock is applied to pin 3 of the multiplexer Z43. Since the multiplexer is switched to its "1" state, the counter Z58 receives the basic clock frequency at its pin 14. It is noted that the output of flip-flop Z70 at pin 9 is tied to pin 2 of the multiplexer. However, this is not performing any function at this time since the multiplexer is not switched to its "0" state.

The outputs from the counter Z58 are shown at lines C, D, E and F in FIG. 5. In FIG. 5 the arrows indicate the place where all outputs are 0. It is noted in FIG. 5 that the lines C-F do not count directly up to 11 and then back to 0 using straight binary counting. Instead, the output count from counter Z58 goes from 0–5 and then on the next clock it goes from binary 5 to binary 8. From 8 it counts normally to binary 13 and then in the next cycle it goes back to binary 0.

The inputs at pins 6 and 7 of counter Z58 control the clearing of the counter to 0. The signal CTR to these input pins is generated in FIG. 14A at the output pin 8 of the inverter Z42. Normally, the signal CTR is low. Only during automatic testing is CTR allowed to go high and clear the device Z58.

The output pin 12 from the counter Z58 is identified in FIG. 13A as DOT 1. Pin 9 of the counter is labeled DOT 2. These two signals are NANDed by the gate Z24 at pins 1 and 2 to provide an output at pin 3 shown in line G of FIG. 5. This signal is called the LATCH signal and is used in the video processing circuitry.

The input pins 6 and 10 of device Z43 are tied together and connect to the output pin 8 of counter Z58. The resulting output is at pins 7 and 9 of the multiplexer Z43. The signal at pin 9 is referred to as the CHAIN signal and is the main source for the divider chain comprising devices Z65, Z50, Z12, and Z32. The output pin 7 of multiplexer Z43 is labeled "C1" and is tied to pin 10 of device Z64 which is one of the video RAM multiplexers. The signal C1 is used to address the video RAM's least significant bit.

For the 32 character format, the pin 1 of the multiplexer Z43 is in its low state and therefore pins 2, 5, and 11 are tied to the respective outputs at pins 4, 7, and 9. Thus, the half clock frequency from pin 9 of the flip-flop Z70 couples to the output pin 4 of the multiplexer Z43. Pin 7 of the device Z43 is held low all the time and the output CHAIN signal is now one coupled directly from the output pin 9 of the counter Z58 shown in line E of FIG. 5. For the 32 character format, FIG. 5 shows the outputs from the counter Z58 at lines H through K. It is noted that the waveform at line B in FIG. 5 is used as the input to the divider counter Z58 and thus the counter is used as a divideby 6 counter. The output at pin 9 of the counter will be the CHAIN signal instead of at pin 8 in the 64 character format. However, the frequency of the CHAIN signal has not changed. In the 64 character mode, the master clock was divided by 12 to provide the chain frequency. That is 10.6445 MHz was divided by 12 to provide a frequency of 887.041 KHz. In the 32 character mode, one-half of the master clock was used, divided by 6 to provide the same end frequency of 887.041 KHz. However, two signals did change. In the 64 character format, the latch pulse was only one clock cycle wide having a period of 6 clock cycles. In the 32 character mode, the pulse width has doubled to two clock cycles and its period is now 12 clock cycles. The other signal that changed was C1. It was a square wave at the same rate as the chain signal for the 64 character format, but in the 32 character mode, it is held low at all times. The signal LATCH is used to delay a character between the RAM and the character generator. The signal C1 determines if the video RAM has 1024 or 512 useable addresses.

DIVIDER CHAIN

Figure 6:
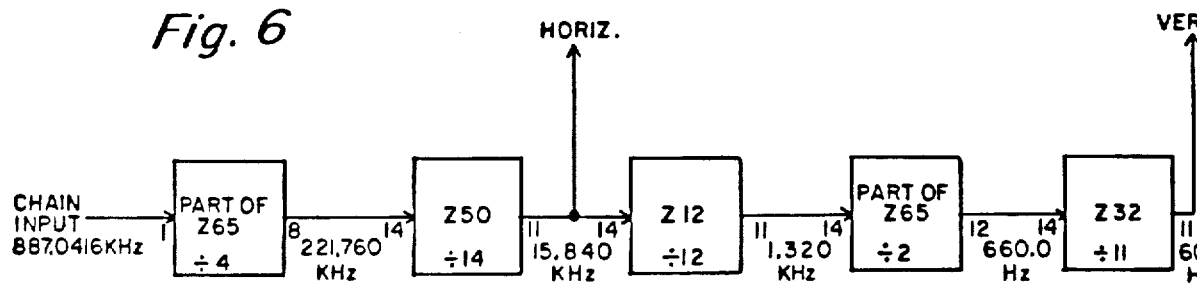
FIG. 6 is a block diagram showing representative frequencies in the video divider chain.

The divider chain circuit comprises 4 bit ripple counters Z65, Z50, Z12 and Z32 shown in FIG. 13A. FIG. 6 shows a simplified block diagram for the divider chain to enable an easier understanding of the counter chain.

Each of the counters comprising the chain may be a 4 bit counter having two different clock inputs coupling to respective successive stages of the counter. In input at pin 14 clocks all stages of the counter whereas an input at pin 1 counts only the last three stages of the counter.

As depicted in FIG. 6 the counter Z65 may be considered as being separated into two different parts. The chain input from the conditioning logic is applied to pin 1 of the counter. The outputs B and C from this counter couple to the multiplexer Z64 and are used for addressing the video RAM. The output at pin 8 from counter Z65 couples to the next counter Z50 in the chain. This portion of counter Z65 divides the chain frequency by 4 as indicated in FIG. 6. Since the chain frequency is 887.0461 KHz, the output of counter Z65 at pin 8 is then 221.760 KHz.

The next counter in the chain is counter Z50. The input of this counter is on pin 14 from counter Z65 and the divider frequency is at pin 11. This device is externally modified to divide the input frequency by 14. The counter Z50 counts up normally to a binary value of 13. The following shows the counter outputs at that count:

Pin 12: Output A=1
Pin 9: Output B=$\emptyset$
Pin 8: Output C=1
Pin 11: Output D=1

Upon the next negative transition of the clock pulse the outputs are as follows:

Pin 12: Output A=$\emptyset$
Pin 9: Output B=1
Pin 8: Output C=1
Pin 11: Output D=1

This provides a 14 count. The AND gate Z66A accepts the B, C and D outputs from counter Z50. The output of the gate Z66A at pin 6 goes high under the second condition listed above and thus clears the counter Z50 back to 0. This clear pulse is quite rapid on the order of about 50 NANO seconds. The time that counter Z50 is actually reading binary 14 is so short that it can essentially be ignored. Therefore, counter Z50 counts from 0–13 and is then reset back to 0. Since the frequency of 221.760 KHz is inputted to the counter Z50, the output at pin 11 is 15.840 KHz. This frequency is used by the sync generator circuits to produce horizontal sync as illustrated in the block diagram of FIG. 6.

The next divider or counter in the chain is counter Z12. This counter is wired to provide a division by 12. In this connection, note the gate Z66B. The counter Z12 counts up normally until the outputs enable AND gate Z66B. This happens at the 12th falling edge of the clock. Gate Z66B, pin 8 will then go high and clear the counter Z12 back to 0. Once again, this clear pulse is essentially ignored and hence we can consider the counter Z12 as a divide-by 12 counter. With a frequency of 15.840 KHz being applied at its input, the output at pin 11 of the counter is thus 1.32 KHz.

The next counter in accordance with the illustration of FIG. 6 is the other part of the counter Z65. Thus, note the output pin 11 from counter Z12 coupling back to the input pin 14 of counter Z65. The output from this counter with regard to its second part is taken at pin 12 which couples back down to counter Z32 at its input pin 14. This portion of counter Z65 divides the 1.32 KHz signal by 2 and therefore, the frequency at pin 14 at the input of counter Z32 is a frequency of 660 Hz.

The counter Z32 is the last counter in the chain. It divides the 660 Hz input by 11 producing a 60 Hz signal. When the output from the counter Z32 equal binary 11, the gate Z66C outputs a clear pulse to reset the counter Z32 back to 0. The 60 Hz output at pin 11 is used by the sync generator circuits to produce the vertical sync (VDRV) for the video monitor.

VIDEO RAM ADDRESSING

Figure 13B:
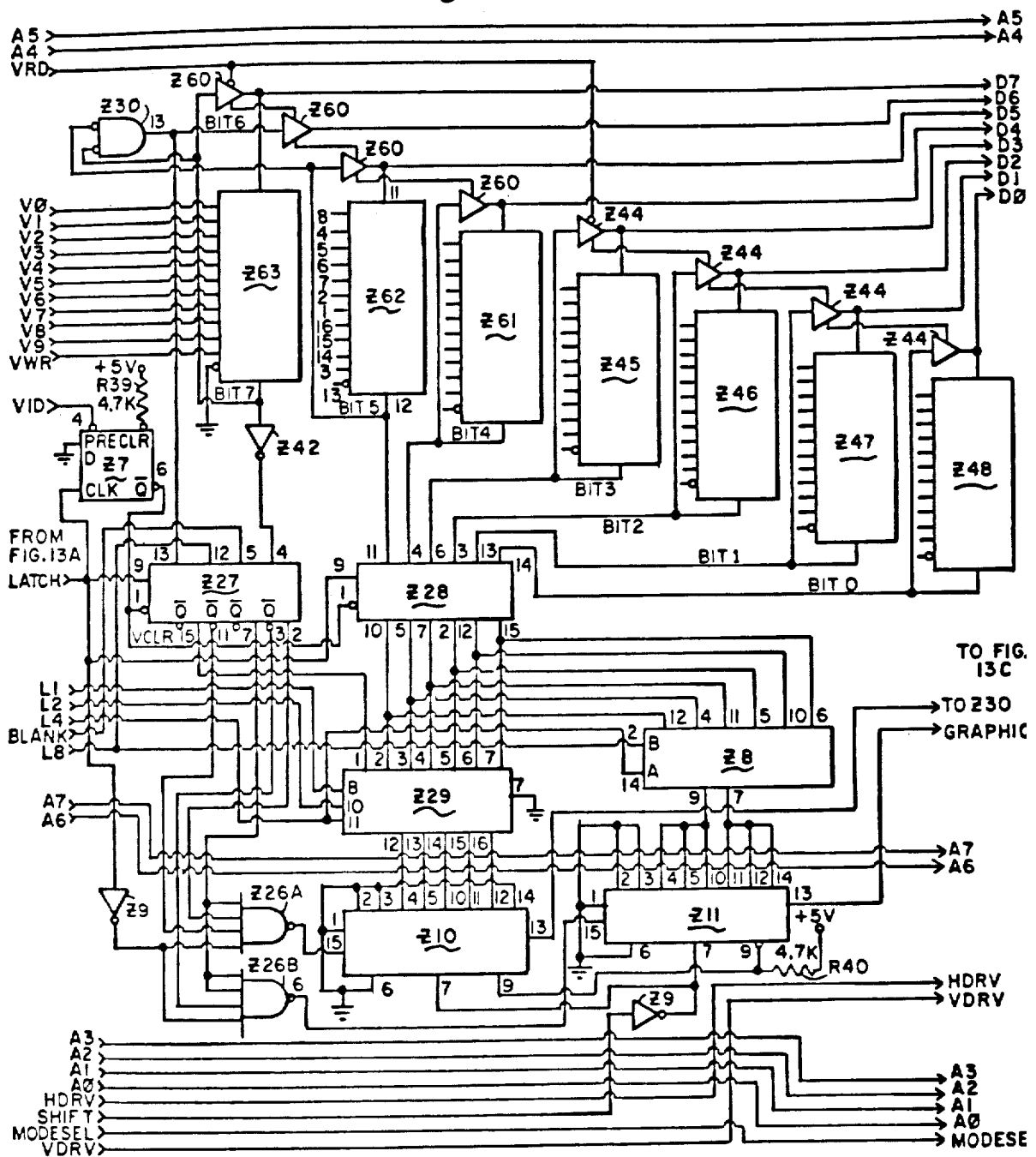

The video RAM 22 depicted in FIG. 1 is addressed for different purposes. First, the CPU addresses the video RAMs to read data from or write data into specific locations of memory. The divider chain also addresses the video RAM so that data contained in memory can be processed and displayed on the screen. The video RAMs are either addressed by the CPU or by the divider chain through the use of the three multiplexers Z64, Z49, and Z31 depicted in FIG. 13A. These three multiplexers are used for video RAM addressing. From the divider chain previously discussed there are 10 address lines that are used to address the video RAMs Z45–Z48 and Z61–Z63 as shown in FIG. 13B. These addresses are identified as V0–V9 coupling in groups from the multiplexers Z64, Z49 and Z31. The chain conditioning logic supplies from multiplexers Z43 the signal C1. Counter Z65 supplies three addresses identified in FIG. 13A as R1, C2 and C4. The counter Z50 supplies three addresses—C8, C16 and C32. The counter Z32 supplies the remaining addresses R2, R4 and R8.

Assume an array of rectangles; 16 rectangles vertical and 64 rectangles horizontal. This would represent a total of 1024 rectangles. One could specify any one rectangle by starting at the top left hand corner going down a predetermined number of rows and moving to the right a predetermined number of columns. The 16 rows are assigned a binary number from 0 to 15. The 64 columns are assigned a binary number from 0 to 63. Thus, rectangle 0-0 is the one in the upper left hand corner of the array. Similarly, rectangle 15–63 is in the lower right hand corner. Thus, 4 bits of binary information specify any one of the 16 rows and 6 bits of binary information specify any one of the 64 columns. This is exactly the addressing format used by the counter chain. Signals C1, C2, C4, C8, C16 and C32 specify any column and signals R1, R2, R4 and R8 specify a row. The row/column addressing format is very useful in trouble-shooting video problems in the system.

The column and row address outputs from the divider chain are applied to the "1" inputs of the multiplexers. Part of the address bus from the CPU is tied to the "0" input of the multiplexers. The outputs from the multiplexers are tied to the video RAMs or to other control logic associated therewith. As far as control is concerned in FIG. 13A there is shown the signal VID* that is generated in the address decoding section. This signal selects the video RAMs. Pin 1 of the three multiplexers Z64, Z49 and Z31 receive this signal VID*. When the CPU wants control over the video RAM, the address decoder recognizes the video RAM address and causes the signal VID* to go low. When this occurs the multiplexers each switch from the "1" position to the "0" position. The counter chain addresses are switched out of the circuit and the CPU has control over the addressing to the video RAMs. When the signal VID* goes back to its high state under control from the CPU, the CPU is switched out and the counter chain takes over. Most of the time the counter chain is in control of the video RAMs. The CPU takes charge only when it needs to modify data.

In addition to the chain and CPU address, there are inputs to the multiplexers not yet mentioned. The first of these inputs is the resistor R49 coupled to pins 6 and 13 of multiplexer Z49. These two inputs, which are not needed in the counter chain control over the video RAM, are pulled up to 5 volts by this resistor. The output pins 12 and 7 of multiplexer Z49 correspond to the inputs at pins 13 and 6. When the chain has control over the video RAM, pins 12 and 7 output a steady high state. Output pin 12 goes to the read/write control for all RAMs thus not permitting any reading or writing associated with the RAMs. The counter chain does not store data in the RAM at the address it specifies and thus pin 12 should be high when the chain is in control. The output pin 7 from multiplexer Z49 couples to the video RAM data buffers Z44 and Z60 (FIG. 13B). When the chain is in control, the RAM data bus is to be disabled and there is no reading from or writing into the video RAMs. A high of the signal VRD* (video read) guarantees that the bus is off. These data buffers look for a low level signal for the enabling thereof.

In FIG. 13A it is also noted that the signals WR* and RD* tie to pins 14 and 5 of the multiplexers Z49. When the CPU takes charge of the video RAMs, the multiplexer output at pin 12 becomes VWR* (video write). The CPU can store data into the video RAMs by causing the signal VWR* to go low. If the CPU wants to read data from the video RAMs, the signal RD* can pass through the multiplexer Z49 and generates the signal VRD*. A low on this line will open the data buffers Z60 and Z44. Addressed video RAM data is then placed on the data bus 14. The CPU processes this data as any other data.

ALPHA-NUMERIC FORMAT

The video terminal 26 shown in FIG. 1 is a cathode ray tube (CRT) which is scanned twice per second. The electronic beam in the CRT travels from top to bottom of the screen and from left to right. Each screen or frame consists of 264 scan lines. 192 scan lines are used in the "picture". The remaining 72 scan lines are used during the vertical interval and as upper and lower boundaries. Nothing is ever written or visible within these 72 lines. There are 1024 character locations per screen or 512, depending upon the state of the signal MODE SEL. Each character line comprises 64 or 32 characters depending upon the state of this signal. There are 16 character lines. Each character line consists of 12 scan lines. An alpha numeric character uses 7 scan lines and thus there are 5 blank scan lines disposed between character lines. A discussion of the graphic format follows.

Some of the output from counters Z65 and Z50 shown in FIG. 13A specify the column address. The outputs from counter Z32 specify the row or character lines. The counter Z12 specifies the scan line in any character line. The outputs from this counter are labeled L1, L2, L4 and L8. These four lines are not used in video RAM addressing because we have already stated and row and column address which will specify any one of 1024 rectangles in our rectangle array. The outputs from the counter Z12 are used in the video processing for enabling the character generator to output correct data for any character because it knows where the CRT's electron beam is scanning. The signal L8 is used by the video processer to BLANK (turn-off) the 5 lines between character lines. Associated with the multiplexers is a NOR gate Z30, pins 8–10. The inputs to these pins couple from multiplexers Z50 and Z32 and provide a signal BLANK*. This signal is used by the video processer to give the 72 scan line blanking for the upper and lower boundaries. It also defines the boundaries on the left and right of the screen.

VIDEO RAMS

The video RAM comprises 7 separate memories, one for each of the data bits D0–D6. Each of these RAMs is a conventional device such as the 2102AN4L device. These RAMs are static RAMs and hence do not require refreshing. The data bus 14 is wired in the same way as with regard to the system RAMs 18. However, there is a different enabling signal which in the case of the video RAMs is the signal VRD*. It is noted that there are 7 RAMs. 6 of these are used for storage of the ASCII code and the 7th is used as a graphic/alpha numeric definition bit. There are thus 8 data lines depicted in FIG. 13B including lines D0–D7. Note the line labeled bit 6 which has its source at the output pin 13 of gate Z30 which is a NOR gate shown as an AND gate with inverted inputs. This gate senses bits 5 and 7 and if both are low, then bit 6 is high.

In addition to coupling to the data bus 14, the video RAMs 22 also couple to the video processing circuitry for the generation of alpha numeric and graphic symbols. This section of the system is discussed now.

VIDEO PROCESSING

The video processor 24 depicted in FIG. 1 may be considered as comprising 5 sub-sections shown in FIG. 13B including the data latch, Z28, the character generator Z29, the graphic generator Z8, associated shift registers Z10 and Z11, a sync generator, and a video mixing/output driver. The data latch temporarily stores an ASCII or graphic word from the video RAM. The latch retains the byte for processing so that the RAM is free to search out the next byte. The character generator is a read-only memory that is addressed by the data latch and the scan line signals. This memory contains the alpha numeric format that makes up all characters. The graphic generator is not a memory but is a four line to one line data multiplexer. It operates somewhat like a bit steering circuit. It steers an ASCII word into a graphic symbol. The shift registers accept data from the character generator or from the graphic generator and convert parallel dot data into serial dot data. Meanwhile the sync generator circuits are accepting timing signals from the timing chain. The sync circuits shape up the horizontal and vertical pulses, serrate the vertical interval and send signals out to video mixing circuitry in serial format. In the video mixing section, the serial dot video and the serial sync are brought together. The resulting composite video signal is then "fine-tuned" in amplitude and dot-to-sync ratio, and then buffered for a 75 ohm output cable. The signal leaves the basic computer system and is applied to the display. In the display, the signal is separated into its separate components to provide a readable image on the screen. The display may be a conventional CRT having built therein conventional raster circuitry.

DATA LATCH

The data latch comprises two separate circuits including the latch Z28 for the ASCII code and the latch Z27 for the graphic bit and blanking signals. The device Z27 may be a 74LS175 and the device Z28 a 74LS174. The latch Z27 is a quad D flip-flop device while the device Z28 is a HEX D flip-flop device. The inputs to latch Z28 are from the 6 video RAMs bits 0–5. The outputs from the latch Z28 couple to the character generator Z29 and also to the graphic generator Z8. The inputs which control latch Z28 are on pin 9 which is the signal LATCH and on pin 1 which is the signal VCLR*. The latch signal at pin 9 is a pulse train previously discussed and depicted in FIG. 5 and developed by the divider chain input conditioning logic. This signal goes low every 6 dot cycles. On the rising edge of the latch signal the ASCII data in the RAMs Z45–Z48 and Z61–Z62 is transferred to the outputs and temporarily stored by the latch Z28. Once this has occurred the RAM data at the input to the latch may now change, and the RAM has time to search for the next ASCII character. At the same time that the latch Z28 stores the code, the divider chain changes video RAM addresses. The video RAM is now looking for the next ASCII word. It has exactly 6 dot times (about 560 NANO seconds in a 64 character format) to define the next word before the latch is commanded to store the next word.

The device Z27 is a smaller latch storage-wise that operates substantially the same as latch Z28. However, instead of storing an ASCII code, it handles the graphic bit and blanking data. The input pin 4 of device Z27 is tied to the output bit 7 from RAM Z63, the graphic RAM by way of the inverter Z42.

Pin 5 of the latch Z27 receives the signal BLANK*. The signal line L8 ties to the input pin 12 and the signal bit 6 is tied to pin 13 of latch Z27. All of these signals are latched into the device Z27 at the same time that the ASCII word is latched into the corresponding latch Z28.

The inputs to device Z27 are essentially independent whereas the inputs to the device Z28 represent a coded word. The graphic bit which is bit 7 coupled from memory Z63 couples by way of inverter Z42, to pin 4 of the latch Z27. This bit determines if the ASCII word contained in the latch Z28 is an alpha numeric character or a graphic word. The input to pin 5 of the latch Z27 is the signal BLANK*. This signal comes from the NOR gate Z30 at pin 10 (FIG. 13A), and controls the upper, lower, left and right boundaries of the video display. When the signal BLANK* is high, the electron beam of the CRT is allowed to draw on the screen. When the signal BLANK* goes low, the beam is in a boundary area so it prevents the beam from drawing anything. The signal L8 is connected to the input pin 12 of the latch Z27. This signal also acts somewhat as a blanking signal. This signal specifies where the electron beam is located in any character line. When the signal L8 is low, this allows the beam to output alpha numeric dot data. When the signal L8 goes high, this shuts off the beam because it is now scanning one of the five scan lines between character lines. The last bit of data is coupled to pin 13 of the latch Z27. This input couples from the output pin 13 of gate Z30. This is the signal that is derived from the signals bit 5 and bit 7. This is the only bit stored in the latch Z27 that could be considered part of the ASCII word in that this determines whether the word represents an alpha numeric character or a graphic word. The output corresponding to the input pin 13 at pin 15 is applied to the input pin 1 of the character generator Z29 discussed in detail hereinafter.

The input pin 1 of both latches Z27 and Z28, when low, forces the latches to their clear state providing all zeroes at the output terminals. This signal is shown as signal VCLR* (video clear) and is coupled from the output pin 6 of the D flip-flop Z7. This flip-flop disables the data latches during a CPU interruption of the video RAMs. In this regard the input pin 4 of the flip-flop Z7 is tied to the signal VID*. When this signal goes low, the output pin 6 from the flip-flop will also go low. This low signal clears the data latches Z27 and Z28. When the CPU has finished with communication with the video RAMs, the input pin 4 to the flip-flop Z7 goes back to a high state because VID* goes high. The next time data is to be latched into devices Z27 and Z28, the flip-flop Z7 will toggle back to its normal reset state and allow the data latches to operate. This clocking occurs at the input pin 3 of the flip-flop Z7 and is the latch signal. If the device Z7 were not used, the display may be improper. For example, if it is assumed that the CRT was drawing a character when the CPU took command of the video RAM, after the CPU finished, the video processing circuit sees the ASCII code that was in the latch at the time the CPU suddenly took control. The video circuit would try to redraw the character on the screen. The character may then be seen twice, or half of it would be in one place on the display and half in another place. Clearing out the data latch insures that the video processer does not process incorrect data.

CHARACTER GENERATOR

As part of the video processor 24 shown in FIG. 1, there is a character generator depicted in FIG. 13B as device Z29. On the CRT display, each character comprises a dot matrix. As previously mentioned, the matrix is 5 dots wide by 7 dots high. The system also provides for one dot between any two adjacent characters that are not turned on. This provides a period for the end of the sentence, for example. There are 5 dots, a space, 5 more dots, space, etc. Vertical spacing between adjacent data is determined by the frequency of the dot clock. In the system of this invention the dot clock signal is identified as signal SHIFT. The SHIFT signal couples from the multiplexer Z43 and relates to the basic clock frequency. The dot clock is equal to the oscillator frequency in the 64 character format and is equal to one-half the oscillator frequency in the 32 character format. The horizontal spacing between adjacent dots is a function of scan frequency. Thus, each row of dots is aligned along the electron beam's path across the CRT, there being 7 rows of character dots and 5 rows of blanks.

Since each character comprises a pattern of dots, there is to be a way to determine which dot should be on and which dot should be off to form any one character. The character generator controls the dot patterns on the screen.

The device Z29 in FIG. 13B is the character generator and may be a device MCM6670P typically made by Motorola. The 7 bit ASCII word, stored in the data latch Z28, is applied to the inputs of device Z29 at pins 1-7. This input address selects a certain area in the character generator. These inputs may be considered as the higher 7 bits of an address. The lower part of the address is inputted at pins 8, 10 and 11. This 3 bit input selects the row position of the addressed dot pattern. These are signals L1, L2 and L4. The character generator Z29 outputs 5 dots at one time on output lines 12-16. Since each character consists of 7 rows of 5 dots, the character generator actually outputs 7 separate times to build one character.

The following is a description of the manner in which a typical character line is written. Assuming that an ASCII word is in the latch Z28, and that the electron beam is on the first scan line of the character, hence, pins 8, 10 and 11 have a binary 0 applied to then. The generator Z29 outputs the first dot pattern for that particular ASCII code. The next ASCII character is applied to the device Z29. It outputs the first 5 dots for that character. This process continues until the beam has scanned the entire width of the screen. If one could cease action at this time, all one would have would be a line of dots. On the second scan line, the data at pins 8, 10 and 11 is incremented to read binary 1. The RAM is now prepared to read the second row of dots. The first ASCII character is applied and it will output the second row of dots for that character. The first ASCII character is the same character as previously in the latch at the beginning of the first line. The second ASCII word then is put into the latch Z28 and a second row of dots is generated, etc. This process continues until all 64 characters have had the second row outputted under the first row of dots. The line counter increments and we apply the first ASCII word once more. Essentially, we paint a row of dots, increment the line counter and then paint another row. Any character in a line is accessed then at least 7 times. Once the line counter has gone past the 7th dot, all dots should then form the character and this dot pattern should be discernible as a character. After the 7 dot scans are outputted, the electron beam is turned off; and 5 rows of blank dots are outputted. The system is then ready to output the first row of dot patterns for the second character line. The counter Z12 (FIG. 13A) is the counter that increments in binary to provide the proper binary signals L1, L2 and L4. This counter is referred to as the line counter.

GRAPHICS GENERATOR

Figure 7:
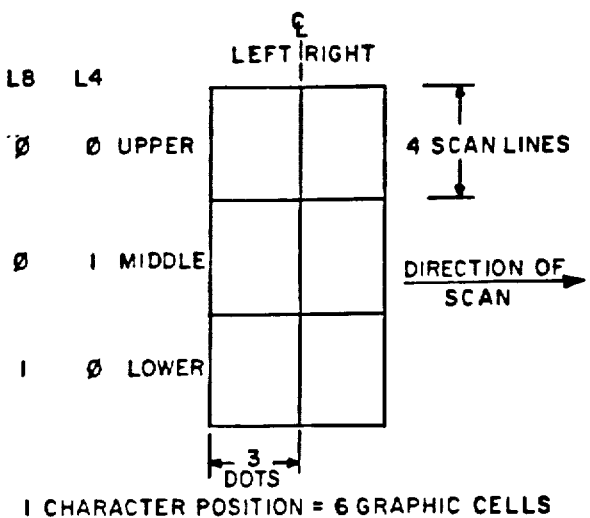
FIG. 7 schematically depicts a graphic cell arrangement from the graphic generator portion of the system.

Previously, with regard to character generation, mention was made of the rectangular array used to define each character. As stated earlier, there are 1024 character locations in the video RAM. If the large rectangle of 12×6 is sub-divided into 6 smaller rectangles, then there is provided the basic graphic cell as depicted in FIG. 7. This cell is the smallest piece of graphic information that is to be displayed on the screen. Eachc cell is 4 scan lines high and 3 dots wide.

Adjacent to the character generator Z29 is the graphics generator Z8 which may be a device 74LS153. Actually, the device Z8 is not a generator but rather it steers the ASCII addresses round to simulate a graphics generator. The input to device Z8 is the ASCII code from the latch Z28 along with the inputs at A and B which are the higher order address lines from counter Z12, namely, signals L4 and L8. These signals can represent any four numbers from binary 0 to binary 3. Please note FIG. 7. However, since counter Z12 does not go to binary 12, we will only be looking for a binary number from 0 to 3. Address lines L8 and L4 are used to specify the vertical address of the 6 graphic cells. There are three vertical addresses: 00 defines the uppermost pair of cells, 01 defines the middle pair of cells and 10 defines the lower pair.

The ASCII word, labeled LB0–LB5 determines if the graphic cell is on or off. The position of one of these inputs to device Z8 determines which side of the center line the cell is located with reference to the diagram of FIG. 7. An input at pin 6 of device Z8 specifies a left hand graphic cell while an input at pin 10 specifies a right hand graphic cell. Similarly, pin 5 denotes left, while pin 11 denotes right and pin 4 notes left while pin 12 denotes right. For example, assuming that the signal LB2 is high and all other inputs to device Z8 are low, this high input at pin 5 is associated with a graphic cell location on the left of the character position. Therefore, depending on the status of signal L8 and L4, LB2 will turn on one of the graphic cells on the left of the center line of FIG. 7. If L8 and L4 are at logical 00, the upper left cell is turned on. If signal L8 and L4 are 01, the middle left cell will be activated.

In summary, the function of device Z8 is to steer the ASCII word essentially around the character rectangle. The vertical position of the graphics in the cell is determined by the status of addresses L8 and L4. The two outputs from the device are labeled left and right. This dot information is applied to the graphics shift register Z11. It is in shift register logic that data from the memory Z63 determines if graphics or alpha numerics are to be written in any one character rectangle.

ALPHA NUMERIC/GRAPHIC SHIFT REGISTER

The device Z10 shown in FIG. 13B is a shift register and is termed herein the alpha numeric shift register. The device Z11 is the graphic shift register. Both of these devices receive parallel data from their respective generators. The parallel dot data is loaded into the registers and the dot clock (labeled SHIFT) shifts the dots out, one behind the other, to the video mixer comprising transistors Q1 and Q2.

There are some restrictions as to when the alpha numeric shift register may send its serial data. First, the data must be alpha numeric and not graphic. Second, the electron beam is to be on one of the 7 scan lines that are reserved for dot data and not on one of the 5 lines that are blanked between character lines. Third, the electron beam is to be on one of the 192 scan lines that define the video portion of the screen. Once all three restrictions are met, the dot data is parallel loaded into the register. NAND gate Z26A at its input pins insures that all conditions are met before data is stored in the shift register Z10. The delay bit 7* is coupled from the output pin 2 of latch Z27 and couples to one input of gate Z26A. When this input is high, data in the memory Z63 is low thus defining an alpha numeric character rather than a graphic. The delayed signal L8 has its source at pin 11 of the latch Z27 which couples to another input of the gate Z26A. When this input is high, the beam is scanning in a character line and not between the character lines. The delayed BLANK signal has its source at pin 7 of the latch Z27 and is tied to a further input of the gate Z26A. When this input is high, the electron beam is in the video portion of the screen and is not located near a sync pulse or in some boundary region. All three restrictions have then been met. The input at another pin of the gate Z26A is tied to the inverted signal LATCH. When this input goes high, the dot load process is activated by a low at the output of gate Z26A. Upon the next clock pulse by the SHIFT signal at pin 7 of the register Z10, the dot data is loaded into the shift register. After the signal LATCH goes back high (one dot time after going low), the shift register starts clocking dot data out at its pin 13 in a serial stream. When the signal LATCH goes high, pin gate Z26A has its output pin go high. Thus, each time that the signal LATCH goes high, it forces ASCII and conditional data to be stored in devices Z27 and Z28. During this time this shift register Z10 is not shifting dots out. This register only shifts data out when the input pin 15 is high. When this is low, this forces the shift register Z10 to load data from the character generator.

It is noted that there are unused inputs to the shift register Z10. Pin 9 is a clear input which is pulled up by way of resistor R40. When this pin is low, the screen is blanked. Pins 14, 3, 2, 1 and 6 are tied to ground. Pin 14 gives the blank dot between adjacent characters. Pins 2 and 3 are not used but are reigster inputs like pins 4 and 5. Pin 1 is for serial data input and pin 6 inhibits the clock input. They are not necessary in the particular application shown in the drawing.

The operation of the graphics shift register Z10 is similar to the operation of the shift register Z11 except for the conditions that must be met for its use. First, the memory Z63 must specify a graphics character instead of an alpha numeric character. Second, the electron beam is to be in the video region of the screen. Furthermore, since a character rectangle ends where another starts, there is no inter-character line blanking. If one turns on all of the graphic cells, there will be a full large square with no holes and boundaries surrounding the square. Once all of the restrictions are met, graphic dot data may be loaded into register Z11 for shifting to the video mixer. The other NAND gate Z26B having its output at pin 6 is used as the graphics load enable this gate senses all of the proper restrictions for graphics. It is noted that the inverse of delay bit 7* is used coupled from pin 3 of device Z27. This signal is applied to one input of gate Z26B. When high, this input tells gate Z26B that the memory Z63 contains a "1" which defines a graphic code rather than an alpha numeric code. The signal delay BLANK is tied to two inputs of the gate Z26B. When this signal is high, this tells the gate that the electron beam is indeed in the video portion of the screen. Once all conditions are met and the signal LATCH goes low, the gate Z26B has its output go low. This signal will load dot data into the shift register Z11 and when the input pin 15 goes back to its high level, the shift process will start. The 6 graphic dots are shifted out on the output pin 13. These 6 dots represent dots in a series along a single scan line within the rectangle of FIG. 7. It is also noted that pin 9 of the register Z11 is pulled up by resistor R40. Likewise, pins 3, 2, 1 and 6 are tied to ground but pin 14 is used. In graphics there is not a blank space between character rectangles.

SYNC GENERATOR

The sync generator circuit accepts timing signals from the divider chain to develop horizontal and vertical sync pulses for the display. These pulses are used by the display to control the electron beam of the CRT. The sync generator receives horizontal and vertical drive signals and provides a single composite output signal referred to as the SYNC signal.

Figure 13C:
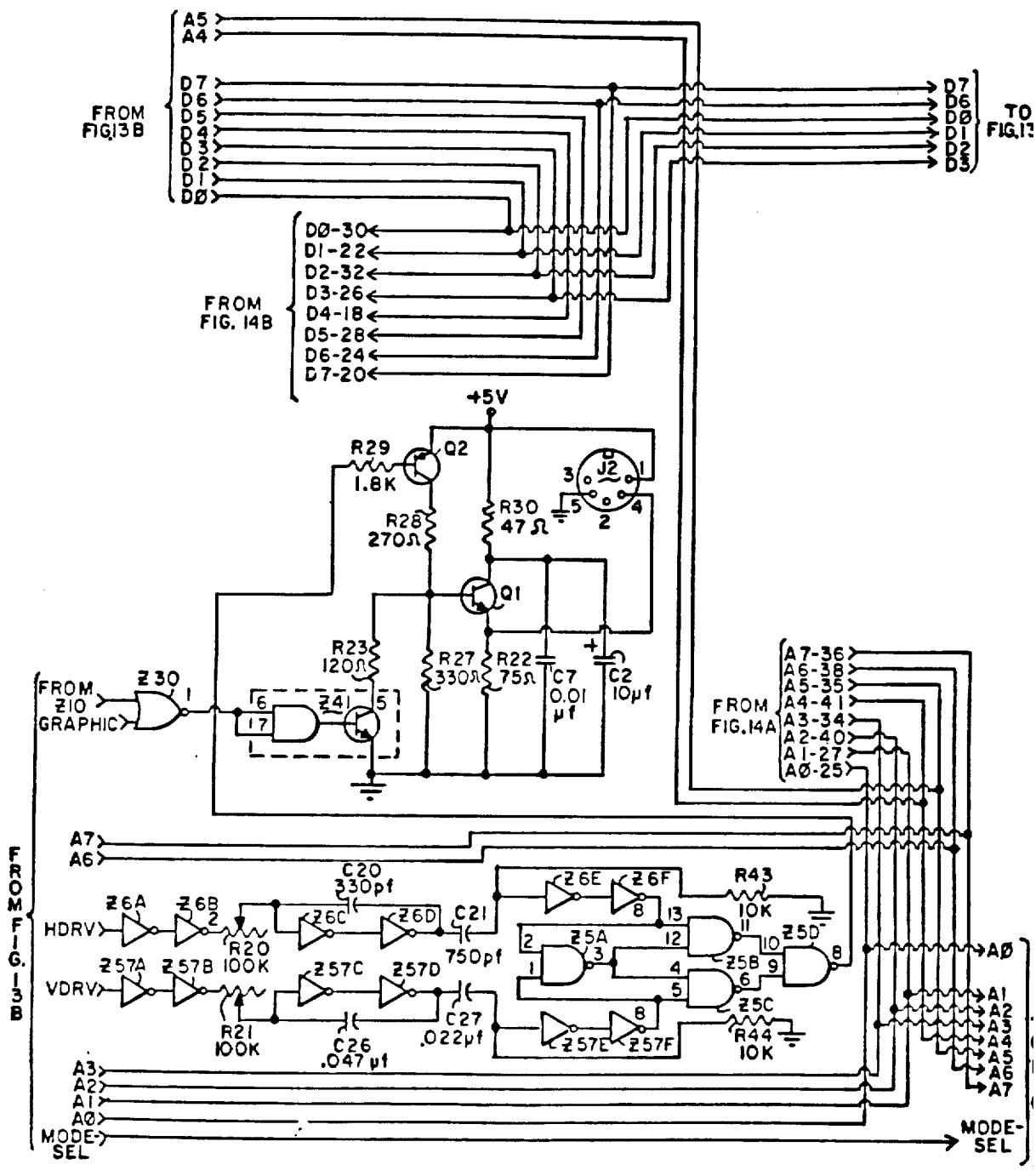
Figure 13D:
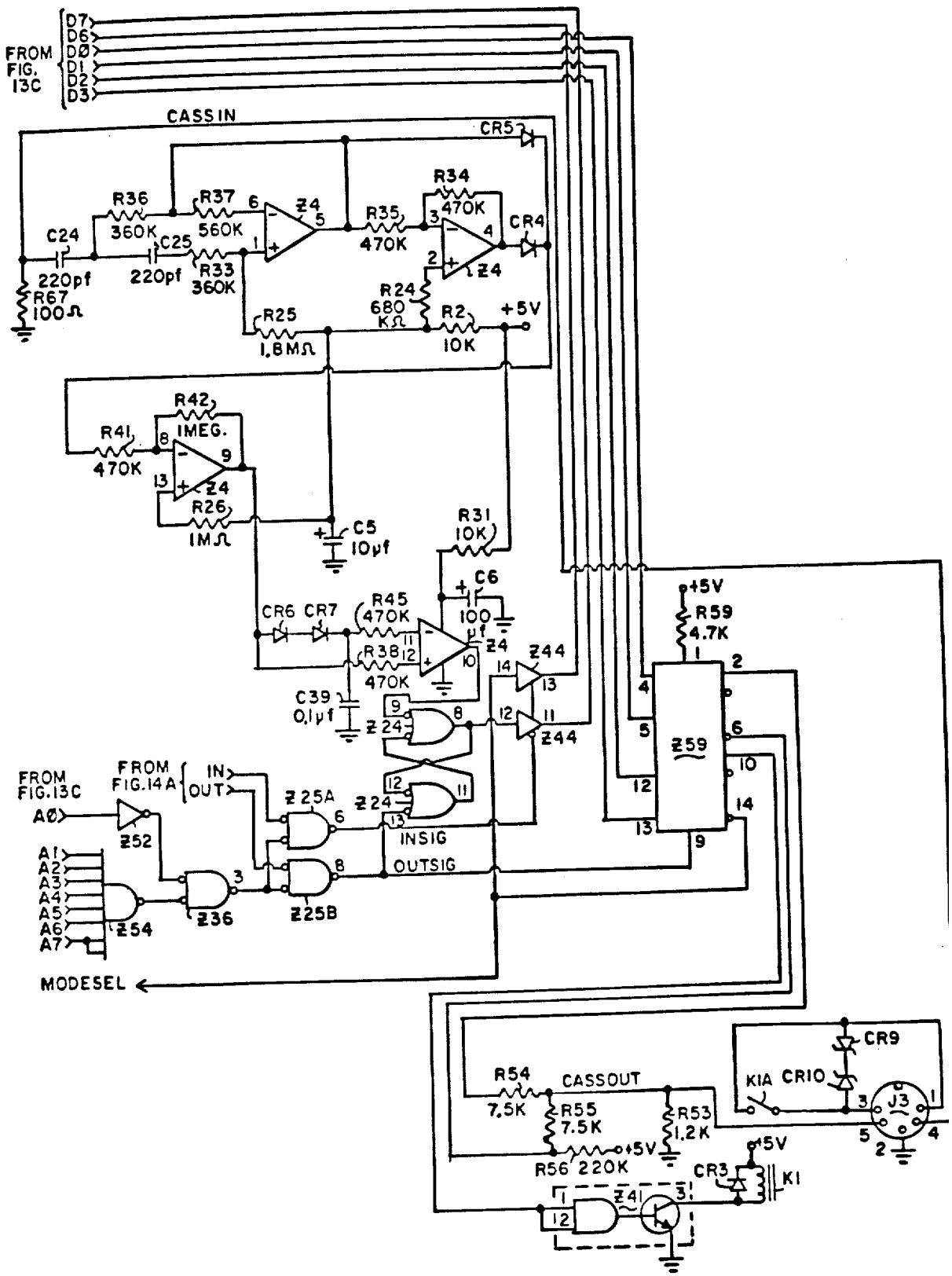

For the sync generator refer to FIG. 13C. The inverters Z6A, Z6B, Z6C, Z6D are used to generate the horizontal pulse while inverter gates Z57A, Z57B, Z57C, Z57D generate the vertical pulse. Signal HDRV (horizontal drive) is taken from the divider chain at counter 50, pin 11. This signal is buffered by gates Z6 and applied to potentiometer R20. This potentiometer controls where the vertical pulse starts in reference to the signal HDRV. When the wiper of potentiometer R20 is close to pin 2 of gate Z6B, the horizontal pulse will start almost at the same time as the signal HDRV goes high. When the wiper is moved in the opposite direction, there is a delay between the time the signal HDRV goes high and the time the horizontal pulse starts. This phase shift if performed by potentiometer R20 in combination with capacitor C20 and the two other inventers Z6C, Z6D. This circuit arrangement provides the complete shift network.

In operation, when the signal HDRV goes high, this causes the output at pin 2 of gate Z6Bto go high to say 5 volts. A current flows through potentiometer R20 charging capacitor C20. While this capacitor charges, the voltage at the input of gate Z6C slowly increases from 0 as the current through potentiometer increases. After a length of time, the voltage to gate Z6C is sufficiently positive.

When that occurs, the output pin of the gate Z6D goes high. This causes capacitor C20 to charge rapidly. The logic stays in this mode until the signal HDRV goes to its low state. At that time the capacitor C20 starts to discharge at the same rate it charged. When the voltage at the input pin of gate Z6C decreases to a logic 0 level the output of gate Z6D goes low. Capacitor C20 then rapidly discharges. The process cycle is now completed until the next HDRV signal goes high. The time and voltage level at the input 3 of gate Z6C stays above the minimum logic 1 level determines the amount of shift from the signal HDRV. The effect of potentiometer R20's position which adjusts the time delay, on the screen is a horizontal shift of video display.

After the horizontal signal is phase shifted, the horizontal pulse is shaped. The circuit including capacitor C21 and resistor R43 form a differentiation network which creates a smaller pulse of no width from the shifted HDRV signal. When the output of gate Z6D goes high, capacitor C21 and resistor R43 differentiate the rising edge. A narrow pulse is passed to gate Z6E inverted twice to provide a like output pulse at the output of gate Z6F. This provides a pulse of about 4 microseconds duration referred to as a horizontal sync pulse.

The vertical sync phase shift operates in the same manner as the horizontal phase shift. Instead of the gates Z6, there are provided a series of gates Z57A-Z57F with potentiometer R21 and capacitor C26 forming the delay network. The differential network comprises capacitor C27 and resistor R44. The only basic difrence between the horizontal and vertical circuits is the value of the two capacitive devices.

HORIZONTAL AND VERTICAL MIXING

Once the two sync pulses are phase-shifted and pulse-shaped, they are coupled to the gate arrangement including gate array Z5 comprised of four separate NAND gates Z5A-Z5D. This gate arrangement is used to mix the two signals together and serrate the vertical interval. In this connection, reference is made to FIG. 8 which shows idealized waveforms at different locations of the gate array Z5. FIG. 8 identifies each of the pin connections at gate array Z5. Line A shows the horizontal pulses. Line B shows the vertical pulses, pins 1 and 5 of gate Z5 are tied to the waveform shown at line A. The resulting output pin 3 of gate Z5 is shown in line C of FIG. 8. The waveform at line C is now used as a source to NAND the horizontal and vertical syncs once more. Line D shows the result of combining lines A and C. Line E depicts the result of providing a NAND operation between lines B and C. Line F shows the resulting waveform which is a mixed sync wave shape created by combining waveforms of lines D and E at gate Z5, pins 9 and 10. It is noted in FIG. 8 at line F that this output is a "false" composite sync. In other words it is inverted away from true form. Secondly, the gate array Z5 may be evaluated down using Boolean algebra into a two input exclusive OR gate. The output at line C may be expressed as $V\overline{H}+H\overline{V}$, where V is vertical sync at line B and H is the horizontal sync at the line A in FIG. 8.

VIDEO MIXING

The video mixing circuitry is shown in FIG. 13C and generates the composite video signal for the display. As previously mentioned, the display may be a conventional CRT having raster scan circuitry. Video mixer accepts both alpha numeric or graphic dot data from the shift register, level-shifts it, and places it atop the composite syncs. The composite waveform is then buffered to drive a 75 ohm impedance and is sent, via cable, to the video display to our video terminal 26 as depicted in FIG. 1.

Dot data from either the shift register Z10 or the shift register Z11 is applied to the inputs of the NOR gate Z30 (FIG. 13C). Signals will not be present at both of these inputs at the same time. While the register Z10, for example, is outputting alpha numeric data, the register Z11 at pin 13 should be continuously at a low level. Conversely, if the shift register Z11 is outputting graphic data, then the output pin 13 from the shift register Z10 is at a low level. The net result at the output pin 1 of gate Z30 is a single wave-shape of video dot data. This data is applied to device Z41 at the input pins 6 and 7.

The composite sync data is coupled from the output pin 8 of gate array Z5 and is applied to the base of transistor Q2. Each time the base of transistor Q2 goes about 0.6 volts below a 5 volt level, the transistor turns on thus applying 5 volts to resistor R28 but actually, the voltage applied to resistor R28 is slightly less than 5 volts due to the voltage drop at saturation across the collector and emitter of transistor Q2.

Figure 9A:
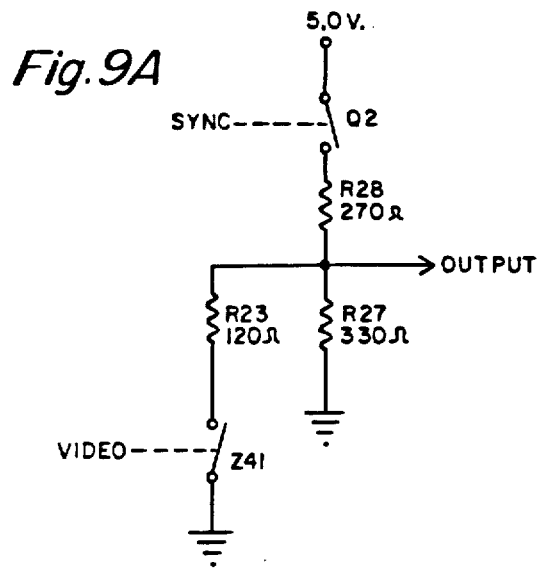
FIG. 9A is a simplified schematic diagram of a portion of the video mixing circuit depicted in detail in FIG. 13C.

The dot data from gate Z30 at pin 1 is inverted by the device Z41 and a resulting output at pin 5 is a normally low signal which goes high only when the shift registers output a dot. The device Z41 is a high current driver. The output at pin 5 is the collector of the output buffer transistor as illustrated. Thus, the video and sync are going to two transistors. These transistors function as switches controlling current flow through the resistor network of resistors R28, R27 and R23. FIG. 9A shows a simplified drawing of this circuit. In FIG. 9A the transistor Q2 and the device Z41 are represented as mechanical switches. When transistor Q2 is opened, there is no voltage applied to resistor R28 and the output node is at ground level. When transistor Q2 closes and with device Z41 also held closed, the output voltage goes up to about 1.23 volts. This voltage is referred to as the black level voltage. A voltage below this level is referred to as a sync level. A voltage above 1.23 volts may be called a white level. Normally, the black level stays at 1.23 volts until the sync occurs at pin 8 of gate Z5 with this output going high turning off transistor Q2 and forcing the output at the node to go to ground. When dot data causes switch Z41 to open, the voltage at the output node increases to about 2.75 volts. Thus, we now have a signal at the output node referred to as the output in FIG. 9A which contains both video dots and sync information. This signal is almost ready for display. All that is necessary is some level shifting and output buffering.

Figure 9B:
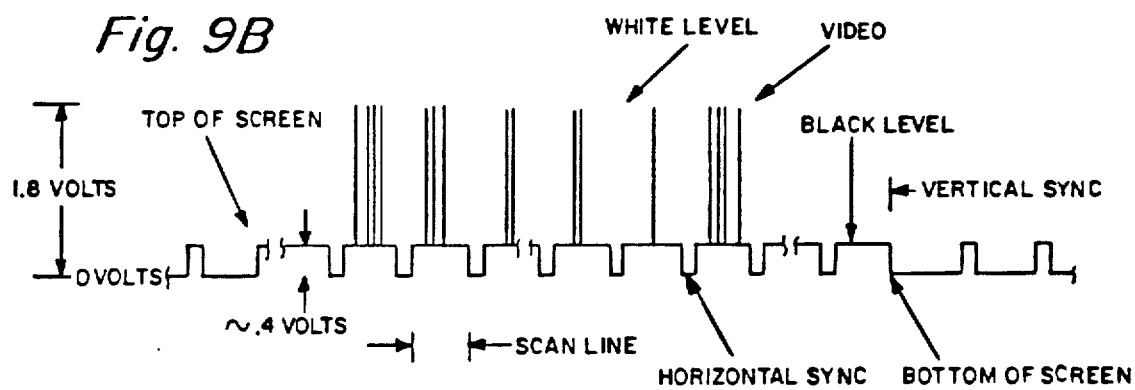
FIG. 9B shows a composite video output signal.

In the video mixing circuit the transistor Q1 is used as a common emitter amplifier. The composite video is applied to the base of transistor Q1 and the emitter outputs the waveform shown in FIG. 9B. This final signal is used by the video terminal 26 for operation thereof. Capacitors C7 and C2, together with resistor R30 form a filter network for the collector of transistor Q1. The capacitors insure the DC bias level on the collector is video free and helps in reducing power dissipation in transistor Q1.

KEYBOARD

Figure 15:
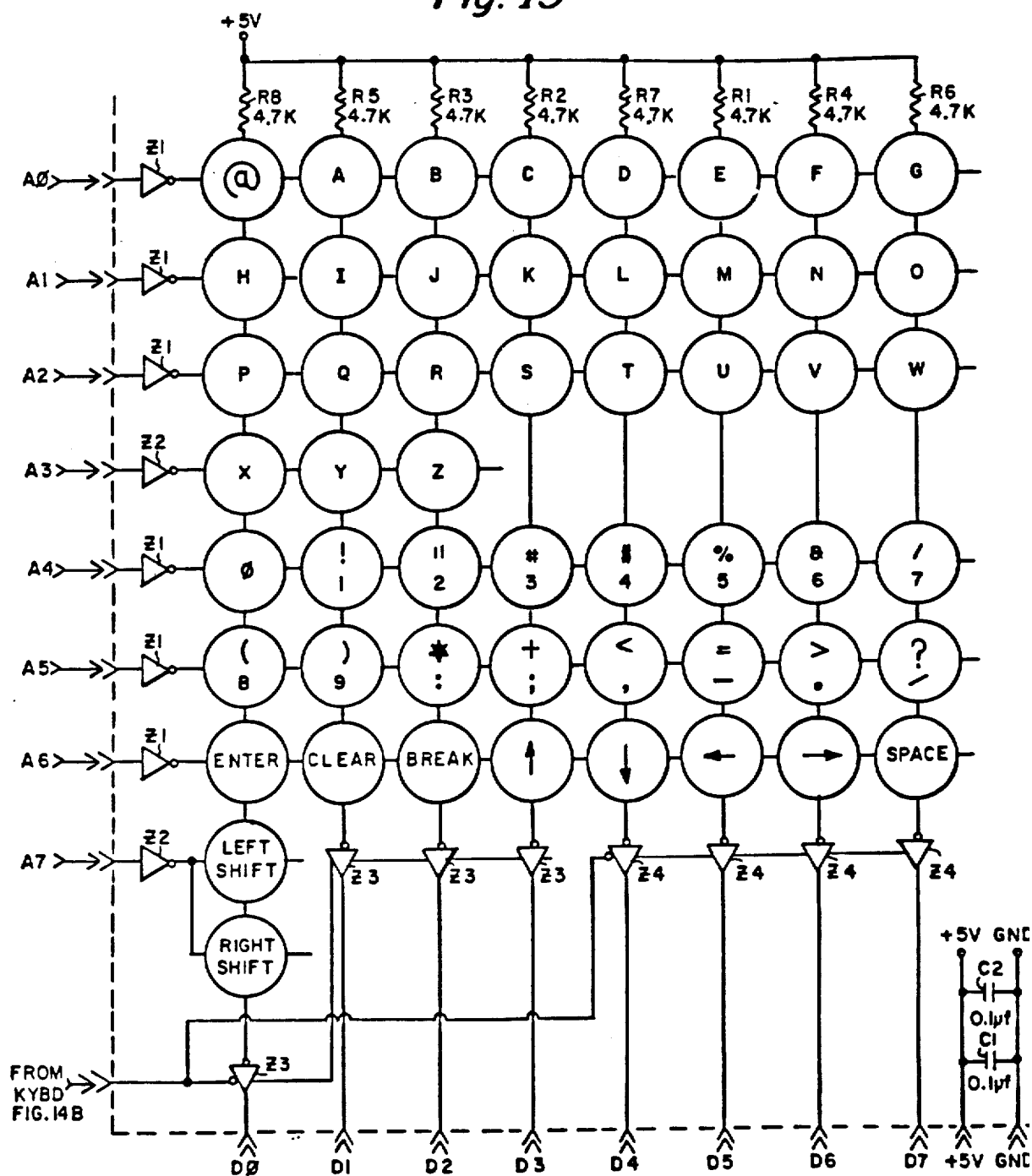
FIG. 15 shows the keyboard matrix of this system.
Figure 16:
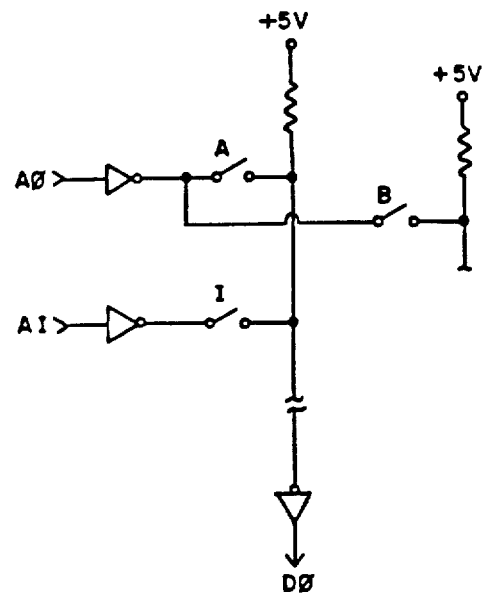
FIG. 16 shows a portion of further detail of the switch arrangement of the keyboard of FIG. 15.

The keyboard 20 of FIG. 1 is described in detail in FIG. 15 and comprises 53 single pole, single throw, normally open keys molded in a plastic base. The base is mounted together with 4 integrated circuits and associated resistors to a keyboard printed circuit board. This keyboard is not of a conventional type that outputs an ASCII code. Rather, each key represents a switch across a matrix node. When the switch is closed, the switch will short out a horizontal line to a vertical line. Software in the ROM 16 detects the node short and generates an ASCII word equivalent for the particular key. The keyboard is accessed by decoder signal KYBD*. When this signal is low, it enables tri-state buffers Z3 and Z4. The inputs to these buffers are normally held high by the pull-up resistors R1-R8 at the top of the keyboard. All of the horizontal address lines A0-A7 go high at the same time that the signal KYBD* goes low. If the CPU detects a logical "1" on one of the data lines D0-D7, this indicates to the CPU that there has been a key pressed on the keyboard. Thus, the CPU continuously is in readiness for such a keyboard detection. Once the CPU detects this, the ROM will then scan the address lines, one-by-one until it finds the "1" output on the data bus. After locating the output, the ROM instructs the CPU to generate the ASCII code for that particular key. At that time the CPU also checks the status of the two shift keys. If one of these keys is not pressed, the ASCII code is not modified. If a shift key is pressed, the ASCII code is modified accordingly. This modification is for providing upper and lower case outputs.

The inverters on the address lines in the keyboard are open collector types. With no key pressed there is no voltage applied to the lines KR0-KR7. When a key is pressed, the associated pull-up resistor supplies a voltage. Then there will be activity on a KR line.

INPUT AND OUTPUT PORT

The computer system of this invention, as previously mentioned, is memory mapped. However, it may be provided with input/output ports. In memory mapping, the CPU knows where the data is. However, with regard to a port, the CPU does not know where the data is located. If the port is some kind of memory device the CPU will output that data to the port and it is up to the port circuitry to process and store the data. In the input condition, the CPU accesses the input port and it is up to the port to find data and feed this data to the data bus which couples to the CPU. The CPU can access up to 256 output/input ports. However, in the system of this invention as described, only one is used and this is the cassette recorder 40 as depicted in FIG. 1 and shown in more detail in FIG. 13D. Its address in HEX is FF. Ports are accessed using only the lower 8 address lines.

PORT ADDRESSING

Because in the basic system only one output/input port is used, there is only provided one port decoder. The NAND gate Z54 (FIG. 13D) monitors the address bits A1-A7 while the gate Z52 monitors the address line A0. When the code HEX FF is outputted on address lines A0-A8 the outputs from these gates Z54 and Z52 couple to gate Z36 providing a low output signal at the output pin 3 of gate Z36. This signal is combined in gates Z25A and Z25B with the signals IN* and OUT*. If there is a low at signal OUT* because the CPU wants to access an output port, there is a signal from the output of gate Z25B identified as the signal OUT SIG*. If on the other hand, the signal IN* is low because the CPU wants to access an input port there will be an output from gate Z25A generating signal in SIG*. The signals IN* and OUT* will never be active at the same time and hence the corresponding signals IN SIG* and OUT* will not be low at the same time.

OUT SIG*

This signal line is used to control two cassette functions and one video function. It is used to generate the audio signal for the cassette recorder under a CSAVE condition. It is used to control the motor of the recorder also. Its video function is to control the signal MODE SEL (mode select). This signal will change between 64 and 32 character formats. The signal OUT SIG* is also for controlling a latch made up of the NAND gates Z24 discussed later and depicted in FIG. 13D as OR gates having inverted inputs.

The device Z59 is a data latch having its clock input at pin 9 controlled by the signal OUT SIG*. This latch accepts data from the data lines D0-D3. The data lines D0 and D1 are tied to pins 4 and 5 of this device. These two inputs are used to input data that is recorded on tape during a CSAVE function. The input data line D2 is connected to pin 12 of the latch. This input controls the status of the motor of the recorder. The last input at pin 13 is connected to provide the signal MODE SEL*.

The inputs to the latch Z59 are stored and transferred to the output each time that the signal OUT SIG* goes high (rising edge triggered). For example, if input D2 is high when the clock signal occurs, the output pin 10 goes to a high state and stays in that state. This signal turns the recorder's motor on. On the other hand if the input D2 is low when the clock signal occurs, the output pin 10 is low and the recorder's motor will be turned off.

CASSETTE MOTOR CONTROL

At the start of a CSAVE function, the cassette recorder motor is to be turned on. Thus, the CPU will cause the signal OUT SIG* to go low and apply a logic high level to data line D2. When the signal OUT SIG* goes high, the high signal on line D2 is transferred and held at pin 10 which is one of the output pins of device Z59. This output is connected to relay driver Z41 at pins 1 and 2. The output pin 3 at the collector of the transistor in Z41 goes low causing current to flow through relay coil K1. The contacts K1A associated with relay K1 close shorting out pins 1 and 3 of the connector J3. These two pins are associated with the remote jack at the recorder. This action turns on the motor of the recorder.

A diode CR3 is coupled across the relay coil K1. This diode is a standard silicon diode used for an anti-chatter function. When power is applied to or removed from the coil K1, a counter EMF is generated. This voltage could be high enough to damage the output transistor of device Z41 or could cause relay K1 to click off and on a few times producing undue wear to the switch contacts. The diode CR3 shunts the counter EMF voltage around coil K1 and prevents transistor damage or relay chatter. The zener diodes CR9 and CR10 which are connected in series are used in somewhat the same way. These diodes protect the switching contact associated with relay coil K1. When the recorder is turned on, a high voltage spike may be produced. The contacts operated by the coil K1 could be welded together but the diodes CR9 and CR10 prevent possible damage by shunting any voltage spikes above a certain level.

CASSETTE AUDIO OUTPUT

After the motor is turned on, the CPU may output data for storage on the cassette tape. All data timing for this output function is software control. The decoder Z59 is used to store data from the CPU and it constructs the output waveform using CPU data. CPU data, under software control, is applied to the latch Z59 on pins 4 and 5 as data inputs D0 and D1, respectively. Output pins 2 and 6 from the device Z59 are connected to a resistor network comprising resistors R53–R56. As the signal OUT SIG* is clocking data into the device Z59, the resulting output on the line labeled CASSOUT, resembles a sign wave constructed of square waves. In this connection, reference is made to FIG. 10 which is an illustration of one bit time of 2 milliseconds.

Figure 10:
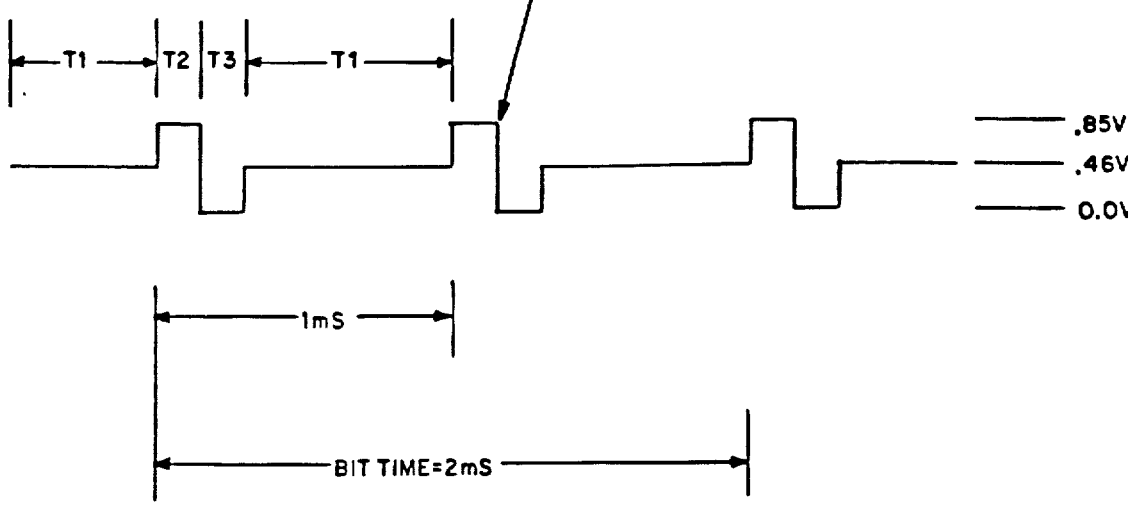
FIG. 10 shows a waveform for the tape recorder output signal associated with the logic circuitry shown in FIG. 13B.

In FIG. 10, the voltage output is a function of the levels on the output pins 2 and 6 from the device Z59. In the period labeled T1, the output is shown at 0.46 volts. The time T1 is the period in which the output pin 2 is zero volts and the output pin 6 is high. The voltage during period T2 is outputted when pin 2 is high and pin 6 is also high. This voltage may be 0.85 volts. The voltage during period T3 is outputted when pin 2 is low and pin 6 is low thus represented by a 0 volt level. From the start of 1 bit time to the start of the next bit time is 2 milliseconds. A 1 or 0 is dependent upon the presence or absence of a pulse between the start of two bit times. For example, when a the CPU outputs a 1 bit, it will generate a start pulse. 1 millisecond later another pulse will be generated. 1 millisecond thereafter a start pulse of a new bit is generated. If this bit is to be a 0, then there will be a 2 millisecond delay before another pulse is generated and this pulse starts the third bit time. Now the pulses are outputted to the cassette recorder at pin 5 of jack J3. This pin is tied to the auxiliary (AUX) input of the recorder. The CPU outputs all of the instructions in the system RAM to tape during this CSAVE function. When the function is complete, audio to the recorder is disabled and a low is outputted at line D2, shutting off the motor of the recorder.

Data is written on the tape in the following manner. When a CSAVE function is to be executed, the CPU via data lines D0-D3 forces the device Z59 to output 128 zero bits. The CPU then outputs HEX A5 used by the CPU during CLOAD for synchronization. A 2 byte starting address and a 2 byte ending address is next added. Then the data follows for however long it is. After the data, the last portion to be stored on the tape is the check sum. This one byte number is the sum of all data added together. It is used by the CPU to insure what it CLOADed-in is what it was CSAVEd-out. If the check sums don't match up, then there was a load error.

CASSETTE AUDIO INPUT

If the recorder could faithfully give back what was sent to it, one could eliminate a quad operational amplifier and a handful of associated componets. However, this cannot be assured and thus there is the need for the operational amplifiers Z4 (four such amplifiers) Actually, the recorder even adds extraneous information to the signal such as motor noise and 60 cycle hum so as to complicate signal processing.

Upon a CLOAD instruction (cassette load) from the CPU, the recorder motor turns on and cassette audio is applied to pin 4 of jack J3. This signal is referred to as signal CASSIN. This audio signal is coupled to capacitor C24 and resistor R67 at the input of the audio processer section. Amplifier Z4 at pins 1 and 6 and output pin 5 form an active filter. This part of the circuit is used to filter out undesired noise and hum present in the signal CASSIN. This is a high-pass filter with about a 2 KHz roll off.

The CASSIN input signal has data pulses riding atop a 60 cycle hum signal. After passing through the high-pass filter, the resulting waveform has teh 60 cycle removed and only the data pulses are left. The signals are swinging above and below a base line of about 2.0 volts. FIG. 11 shows some idealized cassette signals. The signal at line A in FIG. 11 is the type that can be expected at the output of the active filter at pin 5 of one of the amplifiers Z4.

Once the filtering has occurred, the next section of operational amplifier is used as an active rectifier. Note the diodes CR4 and CR5, together with biasing resistors such as resistors R24, R34 and R35. This arrangement provides a full wave rectifier to the data pulses. A typical output on the cathode side of diode CR4 is shown at line B of FIG. 11.

After rectification, the signal is inverted and amplified. The amplifier Z4, pins 8, 13 and 9 are wired to form an inverting amplifier circuit. The ratio of resistor R41 to resistor R42 provides a gain of about 2 for the amplifier. Line C in FIG. 11 shows a typical output at amplifier Z4, pin 9.

The last stage of the operational amplifiers is used as a level detector. In this last stage, the diodes CR6 and CR7 together with capacitor C39 form a power supply of sorts. The amplified audio signal from amplifier Z4 at pin 9 is applied to the anode of diode CR6. Diodes CR6 and CR7 decrease the voltage level of the incoming signal by about 0.8 to 1.1 volts. Capacitor C39 filters the resulting voltage and creates a DC signal such as the one shown on line D of FIG. 11. If the signal output from amplifier Z4 at pin 9 drops below the reference voltage level at capacitor C39 of the amplifier Z4 at pin 10 will go low. It will stay at this low state as long as the voltage on pin 12 stays below the reference voltage. Line E in FIG. 11 shows the resulting output from amplifier Z4 at pin 10. It is noted that a couple of pulses of audio have been lost because the signal did not swing toward ground enough to trigger the amplifier Z4 at pin 10. The negative transition at pin 10 is used to set flip-flop Z24 comprised of two cross-coupled gates. Cassette data is converted into program data by the software in the ROM and the CPU. The data from the flip-flop of cross-coupled gates Z24 is coupled by means of buffers Z44, pins 11, 12 and 13, 14 to the data lines D6 and D7.

IN SIG*

The transfer of data from the cassette to the CPU involves the generation of the signal IN SIG*. The gate Z25 receives the signal IN* from the CPU. This is a control group signal from the CPU. This signal goes low when the CPU wants to input data from a port. Port addressing has already been discussed. A low at gate Z25A and a low at the output of gate Z36, pin 3 causes a low at the output pin 6 at the gate Z25A. This signal is the IN SIG* signal. This signal controls the buffer gates Z44. The gate Z44 at pin 12 is coupled from the pin 8 output of gate Z24. The two gates Z24 are wired to form a set-reset latch. If the input to gate Z24 from pin 10 of device Z4 goes low, pin 8 at its output will go high. Pin 8 is cross-tied to the other gate Z24. If pin 13 is high with pin 12 also being high, the output pin 11 is low. With a high at pin 8 and a low at pin 11, the flip-flop is considered as being in its set state. If pin 8 is low and pin 11 is high, flip-flop is considered as being reset. The flip-flop is set by cassette data and reset by the signal OUT SIG*. The gates Z44 monitor the status of the flip-flop Z24 under command of the signal IN SIG*. When a cassette load signal is entered via the keyboard (CLOAD), the signal OUT SIG* goes low starting the motor of the recorder and resetting flip-flop Z24 by pulsing the input pin 13 low. The first time the input pin 9 of Z24 goes low, this starts the first bit time. This is shown in FIG. 12 at line A. Line D, the output of the latch at pin 8 of Z24 goes high as soon as pin 9 goes low. Next, the signal OUT SIG* goes low after a short time delay as indicated on line C of FIG. 12. This signal resets the flip-flop as indicated in line D of FIG. 12. A short time after the signal OUT SIG* goes back to its high state, the CPU tests the device Z24 at its pin 8 to determine the status by enabling the buffers Z44. Line D is low at this time. The CPU recognizes a logical 0 during bit time 1 as shown by the 0 under line D. The next time line A goes low is the start of bit time 2. The low on device Z24 at pin 9 sets the flip-flop. The signal OUT SIG* resets the flip-flop a short time later. The signal IN SIG* then enables the buffers Z44 and checks the status of the flip-flop. The CPU sees a 0 again, so bit time 2 is a 0 bit. The next low on line A starts bit time 3. Again, its sets the flip-flop and a short time later a signal OUT SIG* resets the flip-flop. Before the signal IN SIG* can test the status, another low comes from the audio processing level detector and sets the flip-flop. Now the signal IN SIG* goes low checking the status. It finds the output pin 8 from the device Z24 is high. The CPU labels bit time 3 a 1 then rather than a 0. Now the CPU resets the flip-flop before bit time 4 starts. Line C shows the added signal OUT SIG* pulse to reset the device Z24. The flip-flop is reset and stays reset until the next low on line A sets it again. The CPU finds bit time 4 to contain a 0. This set/reset process continues until the CPU has read every bit time of the program that was stored in the cassette. It is the responsibility of the CPU to assemble the bit times into data words; the words into text; and store the text in the random access memory.

The basic language of the computer is stored in the ROM and in accordance with the system of the present invention it is quite easy to expand the mathematical and symbolic capabilities. In a first generation system there is employed a 4K ROM whereas a higher generation system employs a 12K ROM. The basic hardware of the system does not change. The only basic different being in the machine language contained in the ROM. In the higher generation machine, there may be contained three 4K ROMs instead of the two 2K ROMs depicted in the drawings. This ROM connects to the CPU at addresses A11, A12 and A13 and also receive the signal ROM*.

In FIGS. 13 and 14 showing the majority of the details of a specific embodiment of the invention, each of the devices has an identification number. For example, devices Z35 and Z51 shown in FIG. 14B are multiplexer devices identified by a well-known part number 74LS157. These types of devices can be made by any one of the well-known integrated circuit manufacturers such as National Semiconductor, Texas Instruments, or Motorola. Below is a table setting forth each of the components including resistors and capacitors along with the specific value or type of component that is used;

| | CAPACITORS |
|---|---|
| C1 | 220 µF, 16 V, Electrolytic, Axial |
| C2 | 10 µF, 16 V, Electrolytic, Radial |
| C3 | 0.01 µF, 10% 25 V, Disc |
| C4 | 10 µF, 16 V, Electrolytic, Radial |
| C5 | 10 µF, 16 V, Electrolytic, Radial |
| C6 | 100 µF, 16 V, Electrolytic, Radial |
| C7 | 0.01 µF, 10%, 25 V, Disc |
| C8 | 2,220 µF, 35 V, Electrolytic, Axial |
| C9 | 10,000 µF, 16 V, Electrolytic, Axial |
| C10 | 10 µF, 16 V, Electrolytic, Radial |
| C11 | 10 µF, 16 V, Electrolytic, Radial |
| C12 | 470 pF, 50 V, Disc |
| C13 | 470 pF, 50 V, Disc |
| C14 | 0.01 µF, 10% 25 V, Disc |
| C15 | 0.01 µF, 10%, 25 V, Disc |
| C16 | 0.1 µF, 10% 12 V, Disc |
| C17 | 0.1 µF, 10%, 12 V, Disc |
| C18 | 0.1 µF, 10%, 12 V, Disc |
| C19 | 0.1 µF, 10% 12 V, Disc |
| C20 | 330 pF, 10% 50 V, Disc |
| C21 | 750 pF, 10%, 50 V, Disc |
| C22 | 0.1 µF, 10%, 12 V, Disc |
| C23 | 0.1 µF, 10%, 12 V, Disc |
| C24 | 220 pF, 10%, 50 V, Disc |
| C25 | 220 pF, 10% 50 V, Disc |
| C26 | 0.047 µF, 100 V, Polyester Film |
| C27 | 0.022 F, 100 V, Polyester Film |
| C28 | 0.1 µF, 10%, 50 V, Disc |
| C29 | 0.1 µF, 10%, 12 V, Disc |
| C30 | 0.1 µF, 10%, 50 V, Disc |
| C31 | 0.1 µF, 10%, 12 V, Disc |
| C32 | 0.1 µF, 10%, 50 V, Disc |
| C33 | 0.1 µF, 10%, 12 V, Disc |
| C34 | 0.1 µF, 10%, 50 V, Disc |
| C35 | 0.1 µF, 10%, 12 V, Disc |
| C36 | 0.1 µF, 10%, 12 V, Disc |
| C37 | 0.1 µF, 10%, 12 V, Disc |
| C38 | 0.1 µF, 10%, 12 V, Disc |
| C39 | 0 1 µF, 10%, 12 V, Disc |
| C40 | 0.1 µF, 10%, 12 V, Disc |
| C41 | 0.1 µF, 10%, 12 V, Disc |
| C42 | 22 µF, 16 V, Electrolytic, Radial |
| C43 | 47 pF, 10%, 50 V, Disc |
| C44 | 0.1 µF, 10%, 12 V, Disc |
| C45 | 0.1 µF, 10%, 12 V, Disc |
| C46 | 0.1 µF, 10%, 12 V, Disc |
| C47 | 0.1 µF, 10%, 12 V, Disc |

-continued

CAPACITORS

| | |
|---|---|
| C48 | 0.1 μF, 10%, 12 V, Disc |
| C49 | 0.1 μF, 10%, 12 V, Disc |
| C50 | 0.1 μF, 10%, 12 V, Disc |
| C51 | 0.1 μF, 10%, 12 V, Disc |
| C52 | 0.1 μF, 10%, 12 V, Disc |
| C53 | 0.1 μF, 10%, 12 V, Disc |
| C54 | 0.1 μF, 10%, 12 V, Disc |
| C55 | 0.1 μF, 10%, 12 V, Disc |
| C56 | 0.1 μF, 10%, 12 V, Disc |
| C57 | 10 μF, 16 V, Electrolytic, Radial |

DIODES

| | |
|---|---|
| CR1 | 1N4735, 10%, 6.2 V, Zener |
| CR2 | 1N5231, 5%, 5.1 V, Zener |
| CR3 | 1N4148, 75 V |
| CR4 | 1N4148, 75 V |
| CR5 | 1N4148, 75 V |
| CR6 | 1N4148, 75 V |
| CR7 | 1N4148, 75 V |
| CR8 | Bridge Rectifier, MDA202, 2A, 202 V |
| CR9 | 1N982, 75 V, Zener |
| CR10 | 1N982, 75 V, Zener |

JACKS

| | |
|---|---|
| J1 | Connector, Socket, D1N, 5Pin |
| J2 | Connector, Socket, D1N, 5Pin |
| J3 | Connector, Socket, D1N, 5Pin |

RELAYS

| | |
|---|---|
| K1 | 5V Relay |

TRANSISTORS

| | |
|---|---|
| Q1 | 2N3904, NPN |
| Q2 | MPS3906, PNP |
| Q3 | TIP29, Driver |
| Q4 | 2N6594, Power |
| Q5 | MPS3906, PNP |
| Q6 | MJE34, Power |

RESISTORS

| | |
|---|---|
| R1 | 68 ohm, ¼ W, 5% |
| R2 | 2.7K, ¼ W, 5% |
| R3 | 750 ohm, ¼ W, 5% |
| R4 | 0.33 ohm, 2 W, 5% |
| R5 | 1K Trim Pot, 30% |
| R6 | 1.2K, ¼ W, 5% |
| R7 | 1.2K, ¼ W, 5% |
| R8 | 100K, ¼ W, 5% |
| R9 | 3.3K, ¼ W, 5% |
| R10 | 1K, Trim Pot, 30% |
| R11 | 3.3K, ¼ W, 5% |
| R12 | 3.3K, ¼ W, 5% |
| R13 | 2.2K, ¼ W, 5% |
| R14 | 12K, ¼ W, 5% |
| R15 | 1.5K, ¼ W, 5% |
| R16 | 1.2K, ¼ W, 5% |
| R17 | 2K, ¼ W, 5% |
| R18 | 5.6 ohm, 3 W, 5% |
| R19 | 220 ohm, ¼ W, 5% |
| R20 | 100K, Trim Pot, 20% |
| R21 | 100K, Trim Pot, 20% |
| R22 | 75 ohm, ¼ W, 5% |
| R23 | 120 ohm, ¼ W, 5% |

-continued

RESISTORS

| | |
|---|---|
| R24 | 680K, ¼ W, 5% |
| R25 | 1.6 Megohm, ¼ W, 5% |
| R26 | 1 Megohm, ¼ W, 5% |
| R27 | 330 ohm, ¼ W, 5% |
| R28 | 270 ohm, ¼ W, 5% |
| R29 | 1.8K, ¼ W, 5% |
| R30 | 47 ohm, ¼ W, 5% |
| R31 | 10 ohm, ¼ W, 5% |
| R32 | 10K, ¼ W, 5% |
| R33 | 360K, ¼ W, 5% |
| R34 | 470K, ¼ W, 5% |
| R35 | 470K, ¼ W, 5% |
| R36 | 360K, ¼ W, 5% |
| R37 | 560K, ¼ W, 5% |
| R38 | 270K, ¼ W, 5% |
| R39 | 4.7K, ¼ W, 5% |
| R40 | 4.7K, 14/W, 5% |
| R41 | 470K, ¼ W, 5% |
| R42 | 1.0 Megohm, ¼ W, 5% |
| R43 | 10K, ¼ W, 5% |
| R44 | 10K, ¼ W, 5% |
| R45 | 470K, ¼ W, 5% |
| R46 | 910 ohm, ¼ W, 5% |
| R47 | 10K, ¼ W, 5% |
| R48 | 4.7K, ¼ W, 5% |
| R49 | 4.7K, ¼ W, 5% |
| R50 | 4.7K, ¼ W, 5% |
| R51 | 4.7K, ¼ W, 5% |
| R52 | 910 Ohm, ¼ W, 5% |
| R53 | 1.2K, ¼ W, 5% |
| R54 | 7.5K, ¼ W, 5% |
| R55 | 7.5K, ¼ W, 5% |
| R56 | 220K, ¼ W, 5% |
| R57 | 4.7K, ¼ W, 5% |
| R58 | 4.7K, ¼ W, 5% |
| R49 | 4.7K, ¼ W, 5% |
| R60 | 4.7K, ¼ W, 5% |
| R61 | 4.7K, ¼ W, 5% |
| R62 | 4.7K, ¼ W, 5% |
| R63 | 4.7K, ¼ W, 5% |
| R64 | 330 ohm, ¼ W, 5% |
| R65 | 10K, ¼ W, 5% |
| R66 | 4.7K, ¼ W, 5% |
| R67 | 100 ohm, ¼ W, 5% |

SWITCHES

| | |
|---|---|
| S2 | DPDT Push |

SOCKETS

| | |
|---|---|
| X3 | 16 Pin I.C. Socket |
| X13 | 16 Pin I.C. Socket |
| X14 | 16 Pin I.C. Socket |
| X15 | 16 Pin I.C. Socket |
| X16 | 16 Pin I.C. Socket |
| X17 | 16 Pin I.C. Socket |
| X18 | 16 Pin I.C. Socket |
| X19 | 16 Pin I.C. Socket |
| X20 | 16 Pin I.C. Socket |
| X32 | 24 Pin I.C. Socket |
| X33 | 24 Pin I.C. Socket |
| X39 | 40 Pin I.C. Socket |
| X71 | 16 Pin I.C. Socket |

CRYSTALS

| | |
|---|---|
| Y1 | 10.6445 MHz, 0.004%, Series Res. |

| | INTEGRATED CIRCUITS |
|---|---|
| Z1 | 723, DIP, Voltage Regulator |
| Z2 | 723, DIP, Voltage Regulator |
| Z4 | LM3900, Dual Input Norton Amp. |
| Z5 | 74C00 CMOS, Quad 2-Input NAND Gate |
| Z6 | 74C04 CMOS, Hex Inverter |
| Z7 | 74LS74, Dual D Positive-Edge Triggered Flip-Flop with Preset and Clear |
| Z8 | Z4LS153, Dual 4-Line to 1-Line Data Selector/Multiplexer |
| Z9 | 74LS04, Hex Inverter |
| Z10 | 74LS166, 8-Bit Parallel In/Serial Out Shift Register |
| Z11 | 74LS166, 8-Bit Parallel In/Serial Out Shift Register |
| Z12 | 74LS93, Divide by 8 Binary Counter Selector/Multiplexer |
| Z21 | 74LS156, Dual 2-Line to 4-Line Decoder/Demultiplexer |
| Z22 | 74LS367, TRI-STATE Hex Buffer |
| Z23 | 74LS32, Quad 2-Input OR Gate |
| Z24 | 74LS132, Quad 2-Input NAND Gate |
| Z25 | 74LS32, Quad 2-Input OR Gate |
| Z26 | 74LS20, Dual, 4-Input NAND Gate |
| Z27 | 74LS175, Quad D Flip-Flop with Clear |
| Z28 | 74LS174, Hex D Flip-Flop with Clear |
| Z29 | MCM6670, Character Generator |
| Z30 | 74LS02, Quad, 2-Input NOR Gate |
| Z31 | 74LS157, Quad 2-Line to 1-Line Data Selector/Multiplexer |
| Z32 | 74LS93, Divide by 8 Binary Counter Selector/Multiplexer |
| Z33 | 2K × 8 ROM A, 450 ns. 2 Patterns |
| Z34 | 2K × 8 ROM B, 450 ns, 2 Patterns |
| Z35 | 74LS157, Quad 2-Line to 1-Line Data Selector/Multiplexer |
| Z36 | 74LS32, Quad 2-Input OR Gate |
| Z37 | 74LS02, Quad 2-Input NOR Gate |
| Z38 | 74LS367, TRI-STATE Hex Buffer |
| Z39 | 74LS367, TRI-STATE Hex Buffer |
| Z40 | Z80 Microprocessor Circuit, Plastic |
| Z41 | 75452, Relay Driver |
| Z42 | 74LS04, Hex Inverter |
| Z43 | 74LS157, Quad 2-Line to 1-Line Data Selector/Multiplexer |
| Z44 | 74LS367, TRI-STATE Hex Buffer |
| Z45 | 2102, AN-4L, 1K Static RAM |
| Z46 | 2102, AN-4L, 1K Static RAM |
| Z47 | 2102, AN-4L, 1K Static RAM |
| Z48 | 2102, AN-4L, 1K Static RAM |
| Z49 | 74LS157, Quad 2-Line to 1-Line Data Selector/Multiplexer |
| Z50 | 74LS93, Divide by 8 Binary Counter Selector/Multiplexer |
| Z51 | 74LS93, Divide by 8 Binary Counter Selector/Multiplexer |
| Z52 | 74LS04, Hex Inverter |
| Z53 | 74LS132, Quad 2-Input NAND Gate |
| Z54 | 74LS30, Triple 3-Input NOR Gate |
| Z55 | 74LS367, TRI-STATE, Hex Buffer |
| Z56 | 74LS92, Divide by 6 Binary Counter Selector/Multiplexer |
| Z57 | 74C04 CMOS, Hex Inverter |
| Z58 | 74LS92, Divide by 6 Binary Counter Selector/Multiplexer |
| Z59 | 74LS175, Quad D Flip-Flop with Clear |
| Z60 | 74LS367, TRI-STATE Hex Buffer |
| Z61 | 2102, AN-4L, 1K Static RAM |
| Z62 | 2102, AN-4L, 1K Static RAM |
| Z63 | 2102, AN-4L, 1K Static RAM |
| Z64 | 74LS157, Quad 2-Line to 1-Line Data Selector/Multiplexer |
| Z65 | 74LS93, Divide by 8 Binary Counter Selector/Multiplexer |
| Z66 | 74LS11, Triple 3-Input AND Gate |
| Z67 | 74LS367, TRI-STATE Hex Buffer |
| Z68 | 74LS367, TRI-STATE Hex Buffer |
| Z69 | 74LS74, Dual D Positive-Edge Triggered Flip-Flop with Preset and Clear |
| Z70 | 74LS74, Dual D Positive-Edge-Triggered Flip-Flop with Preset and Clear |
| Z71 | Not used |
| Z72 | 74LS367, TRI-STATE Hex Buffer |
| Z73 | 74LS32, Quad 2-Input OR Gate |
| Z74 | 74LS00, Quad 2-Input NAND Gate |

-continued

| | INTEGRATED CIRCUITS |
|---|---|
| Z75 | 74LS367, TRI-STATE Hex Buffer |
| Z76 | 74LS367, TRI-STATE Hex Buffer |

| | 4K RAM KIT |
|---|---|
| A3 | DIP Shunt |
| A71 | DIP Shunt |
| Z13 | 4096 bit, Dynamic RAM, 450 ns |
| Z14 | 4096 bit, Dynamic RAM, 450 ns |
| Z15 | 4096 bit, Dynamic RAM, 450 ns |
| Z16 | 4096 bit, Dynamic RAM 450 ns |
| Z17 | 4096 bit, Dynamic RAM, 450 ns |
| Z18 | 2096 bit, Dynamic RAM, 450 ns |
| Z19 | 2096 bit, Dynamic RAM, 450 ns |
| Z20 | 4096 bit, Dynamic RAM, 450 ns |

| | 16K RAM KIT |
|---|---|
| A3 | DIP Shunt |
| A71 | DIP Shunt |
| Z13 | 16384 bit, Dynamic RAM, 450 ns |
| Z14 | 16384 bit, Dynamic RAM, 450 ns |
| Z15 | 16384 bit, Dynamic RAM, 450 ns |
| Z16 | 16384 bit, Dynamic RAM, 450 ns |
| Z17 | 16384 bit, Dynamic RAM, 450 ns |
| Z18 | 16384 bit, Dynamic RAM, 450 ns |
| Z19 | 16384 bit, Dynamic RAM, 450 ns |
| Z20 | 16384 bit, Dynamic RAM, 450 ns |

| | KEYBOARD |
|---|---|
| | Capacitors |
| C1 | 0.1 μF, 10%, 12 V, Disc |
| C2 | 0.1 μF, 10%, 12 V, Disc |
| | Diodes |
| CR1 | LED, HP5082-4850, Red |
| | Keyboard |
| KB1 | DS5300, 53 Key, 2-Shot Key caps |
| | Resistors |
| R1 | 4.7K, ¼ W, 5% |
| R2 | 4.7K, ¼ W, 5% |
| R3 | 4.7K, ¼ W, 5% |
| R4 | 4.7K, ¼ W, 5% |
| R5 | 4.7K, ¼ W, 5% |
| R6 | 4.7K, ¼ W, 5% |
| R7 | 4.7K, ¼ W, 5% |
| R8 | 4.7K, ¼ W, 5% |
| R9 | 330 ohm, ¼ W, 5% |
| | Integrated Circuits |
| Z1 | 74LS05, Hex Buffer with open collector High Voltage outputs |
| Z2 | 74LS05, Hex Buffer with open collector High Voltage outputs |
| Z3 | 74LS368, TRI-STATE Hex Buffer |
| Z4 | 74LS368, TRI-STATE Hex Buffer |
| | Wire |
| W1 | Stranded, Prebonded, LED, Red, 10" |
| W2 | Stranded, Prebonded, LED, Black, 10" |

| | LEVEL II PARTS LIST |
|---|---|
| J1 | Socket, I.C., 24 Pin |
| R1 | Resistor, 4.7K, ¼ W, 5% |
| Z1 | I.C., 4K × 8 ROM, 450 ns, ROM A |
| Z2 | I.C., 4K × 8 ROM, 450 ns, ROM B |
| Z3 | I.C., 4K × 8 ROM, 450 ns, ROM C |
| Z4 | I.C., 74LS42, BCD to Decimal Decoder |

By the foregoing we have described a preferred embodiment of the present system. However, it is understood that numerous modifications can be made in this system without departing from the scope of the invention. For example, in the video generation section there has been disclosed a scheme for generating either 32 characters or 64 characters per line. In this arrangement the clock is controlled to provide characters of two different widths. However, in accordance with another embodiment of the invention the input address lines L1, L2, L4 and L8 could possibly be multiplexed to also provide for an expansion of the number of character lines per page. In the disclosed embodiment there is mention made of the use of 16 character lines. However, in an alternate embodiment these input addresses to the character generator could be controlled so as to provide 16 character lines for the usual 64 character format or alternatively only 8 character lines for the larger style 32 character per line format.

What is claimed is:

1. For a computer system having a central processing unit, a display means, and a plurality of system memory devices including means for storing instructions, a random access memory and keyboard means, address decoder means responsive to an address code from the central processing unit for providing separate outputs corresponding to different coded inputs representative of different capacity memory, selection means coupled from the separate outputs of said address decoder means for selecting predetermined outputs from the address decoder means, wherein the selection means includes a selective shunt means having input terminals coupling to the outputs of said address decoder and output terminals, wherein said shunt means includes a plurality of shunts coupled between said input and output terminals, said random access memory being selectable in different capacities, said shunts are programmed so that the number of shunts correspond to the capacity of the random access memory, and gate means coupled to the output terminals of said shunt means for providing a plurality of separate enable signals for selection of one of the system memory devices available to the central processing unit.

2. A computer system as set forth in claim 1 wherein said address decoder accepts a plurality of address signals with the output of the decoder providing a plurality of output signals only one of which is active at a time.

3. A computer system as set forth in claim 2 wherein said gate means also responsive to a read control signal from the central processing unit for providing a random access memory enable signal.

* * * * *